(12) United States Patent
Anderson et al.

(10) Patent No.: US 10,002,962 B2
(45) Date of Patent: Jun. 19, 2018

(54) VERTICAL FET STRUCTURE

(71) Applicant: International Business Machines Corporation, Armonk, NY (US)

(72) Inventors: Brent A. Anderson, Jericho, VT (US); Huiming Bu, Glenmont, NY (US); Fee Li Lie, Albany, NY (US); Edward J. Nowak, Shelburne, VT (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/139,937

(22) Filed: Apr. 27, 2016

(65) Prior Publication Data

US 2017/0317210 A1 Nov. 2, 2017

(51) Int. Cl.
*H01L 29/78* (2006.01)
*H01L 27/088* (2006.01)
*H01L 21/8234* (2006.01)
*H01L 29/66* (2006.01)

(52) U.S. Cl.
CPC .. *H01L 29/7827* (2013.01); *H01L 21/823412* (2013.01); *H01L 21/823418* (2013.01); *H01L 21/823437* (2013.01); *H01L 21/823487* (2013.01); *H01L 27/088* (2013.01); *H01L 29/66666* (2013.01)

(58) Field of Classification Search
CPC ............ H01L 29/7827; H01L 29/6666; H01L 27/088; H01L 21/823437; H01L 21/823487; H01L 21/823418; H01L 21/823412
See application file for complete search history.

(56) References Cited

U.S. PATENT DOCUMENTS

| | | | |
|---|---|---|---|
| 4,833,517 A | 5/1989 | Heiblum et al. |
| 5,128,272 A | 7/1992 | Ramde |
| 5,326,711 A | 7/1994 | Malhi |
| 6,060,746 A | 5/2000 | Bertin et al. |
| 6,104,061 A | 8/2000 | Forbes et al. |
| 6,150,210 A | 11/2000 | Arnold |
| 6,194,773 B1 | 2/2001 | Malhi |
| 6,207,977 B1 | 3/2001 | Augusto |

(Continued)

FOREIGN PATENT DOCUMENTS

| | | |
|---|---|---|
| CA | 1271266 A | 7/1990 |
| WO | 02086904 A2 | 10/2002 |

(Continued)

*Primary Examiner* — Christine Enad
(74) *Attorney, Agent, or Firm* — Cantor Colburn LLP; Vazken Alexanian

(57) ABSTRACT

Techniques relate to forming a vertical field effect transistor (FET). One or more fins are formed on a bottom source or drain of a substrate, and one or more fins extend in a vertical direction. Gate material is formed to be positioned on sides of the one or more fins. Gate encapsulation material is formed on sides of the gate material to form a trench, such that top portions of the one or more fins are exposed in the trench. A top source or drain is formed on top of the one or more fins such that the top source or drain is laterally confined by the trench in a lateral direction that is parallel to the one or more fins.

18 Claims, 24 Drawing Sheets

(56) References Cited

U.S. PATENT DOCUMENTS

| | | |
|---|---|---|
| 6,518,616 B2 | 2/2003 | Dyer et al. |
| 6,777,744 B2 | 8/2004 | Noble |
| 7,332,386 B2 | 2/2008 | Lee et al. |
| 7,547,945 B2 | 6/2009 | Tang et al. |
| 7,560,728 B2 | 7/2009 | Lin et al. |
| 7,683,428 B2 | 3/2010 | Chidambarrao et al. |
| 7,781,827 B2 | 8/2010 | Rao |
| 7,791,068 B2 | 9/2010 | Meng et al. |
| 7,811,890 B2 | 10/2010 | Hsu et al. |
| 7,910,439 B2 | 3/2011 | Darwish et al. |
| 7,951,667 B2 | 5/2011 | Kim |
| 8,207,032 B2 * | 6/2012 | Fischer ............ H01L 21/82342 438/206 |
| 8,207,566 B2 | 6/2012 | Lee |
| 8,383,477 B2 | 2/2013 | Lee |
| 8,471,310 B2 | 6/2013 | Hynecek |
| 8,633,529 B2 | 1/2014 | Juengling |
| 8,647,947 B2 | 2/2014 | Masuoka et al. |
| 8,653,575 B2 | 2/2014 | Jung |
| 8,912,612 B2 | 12/2014 | Basker et al. |
| 9,035,391 B2 | 5/2015 | Reznicek et al. |
| 9,048,329 B2 | 6/2015 | Kim et al. |
| 9,087,897 B1 | 7/2015 | Anderson et al. |
| 9,099,384 B2 | 8/2015 | May et al. |
| 9,318,581 B1 * | 4/2016 | Guo ................... H01L 29/7853 |
| 9,390,976 B2 * | 7/2016 | Guo ................... H01L 29/7833 |
| 9,472,669 B1 * | 10/2016 | Chiang ............. H01L 29/7848 |
| 2003/0015755 A1 | 1/2003 | Hagemeyer |
| 2006/0273389 A1 * | 12/2006 | Cohen ................... B82Y 10/00 257/331 |
| 2008/0197397 A1 | 8/2008 | Parthasarathy et al. |
| 2011/0006360 A1 | 1/2011 | Ikebuchi |
| 2012/0049294 A1 * | 3/2012 | Chen ................ H01L 21/82343 257/401 |
| 2012/0214285 A1 | 8/2012 | Guha et al. |
| 2014/0159159 A1 * | 6/2014 | Steigerwald ...... H01L 29/66795 257/369 |
| 2015/0054089 A1 * | 2/2015 | Hong .................. H01L 27/0886 257/401 |
| 2015/0084134 A1 * | 3/2015 | Lin .................. H01L 21/82343 257/384 |
| 2015/0091099 A1 * | 4/2015 | Ching .............. H01L 21/82343 257/401 |
| 2015/0279840 A1 * | 10/2015 | Huang ............. H01L 29/66545 257/384 |
| 2015/0295089 A1 * | 10/2015 | Huang ................ H01L 29/7853 257/401 |
| 2015/0318211 A1 * | 11/2015 | Guo .................... H01L 29/7833 257/337 |

FOREIGN PATENT DOCUMENTS

| | | |
|---|---|---|
| WO | 2005091376 A1 | 9/2005 |
| WO | 2013123287 A1 | 8/2013 |

\* cited by examiner

VERTICAL FET STRUCTURE

BACKGROUND

The present invention relates generally to semiconductors, and more specifically, to a vertical field effect transistor (FET) structure.

The field effect transistor is a transistor that uses an electric field to control the shape and hence the electrical conductivity of a channel of one type of charge carrier in a semiconductor material. An FET's conductivity is regulated by a voltage applied to a terminal (the gate) which is insulated from the device. The applied gate voltage imposes an electric field into the device, which in turn attracts or repels charge carriers to or from the region between a source terminal and a drain terminal. The density of charge carriers in turn influences the conductivity between the source and drain.

SUMMARY

According to one or more embodiments, a method of forming a vertical field effect transistor (FET) is provided. The method includes forming one or more fins on a bottom source or drain of a substrate, where one or more fins extend in a vertical direction, and forming gate material on sides of the one or more fins. Also, the method includes forming gate encapsulation material on sides of the gate material to form a trench, such that top portions of the one or more fins are exposed in the trench. Further, the method includes forming a top source or drain on top of the one or more fins such that the top source or drain is laterally confined by the trench in a lateral direction that is parallel to the one or more fins.

According to one or more embodiments, a vertical field effect transistor (FET) is provided. The vertical field effect transistor includes one or more fins on a bottom source or drain of a substrate, where the one or more fins extend in a vertical direction. Gate material is positioned on sides of the one or more fins. Gate encapsulation material is on sides of the gate material to form a trench, such that top portions of the one or more fins are exposed in the trench. A top source or drain is on top of the one or more fins such that the top source or drain is laterally confined by the trench in a lateral direction that is parallel to the one or more fins.

DETAILED DESCRIPTION

Figure 1B:
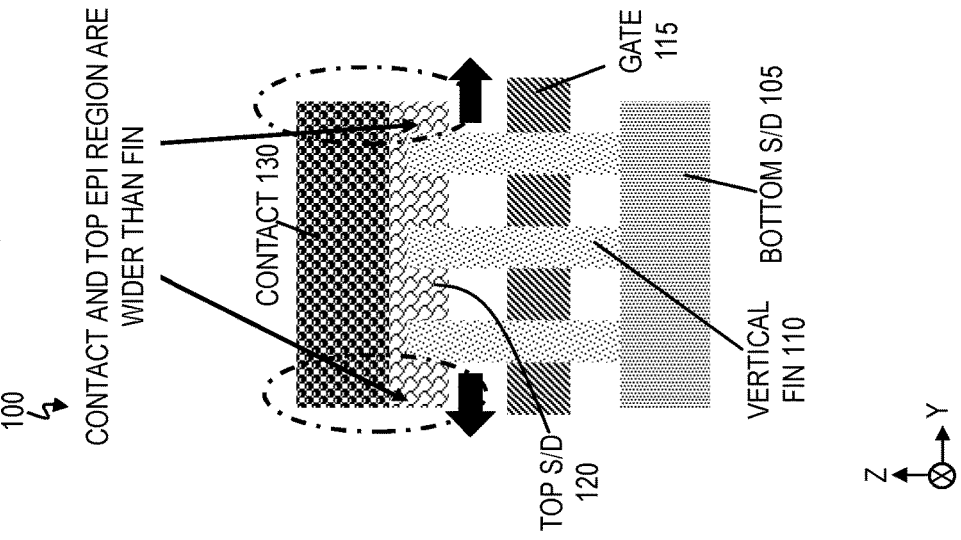
FIG. 1B is another cross-sectional view of the vertical transistor from a different perspective according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

A vertical field effect transistor has a top source/drain (S/D) region, and the top source/drain region has many conflicting demands. A large top source/drain region provides low resistance and a large landing pad for contacts. However, a large top source/drain region adds capacitance and can short to gate and bottom source/drain contacts.

One or more embodiments provide an optimized method and structure for the top source/drain region. Accordingly, the top source/drain provides low resistance, provides a large contact landing pad, and reduces the chance of shorting to the gate or bottom S/D contacts.

To optimize the top source/drain region, one or more embodiments provide both a very wide epitaxial (epi) perpendicular to fin and a narrow epitaxial parallel to fin. A vertical transistor has a vertical fin, and the top source/drain is an epitaxial layer formed on top of the vertical fin. Embodiments are configured to avoid shorting to gate and bottom source/drain contacts based on having the wide epitaxial perpendicular to fin and the narrow epitaxial parallel to fin. It should be appreciated that one or more embodiments provide maximum fin effect width ($W_{eff}$) and may utilize a simple masking step.

Figure 1A:
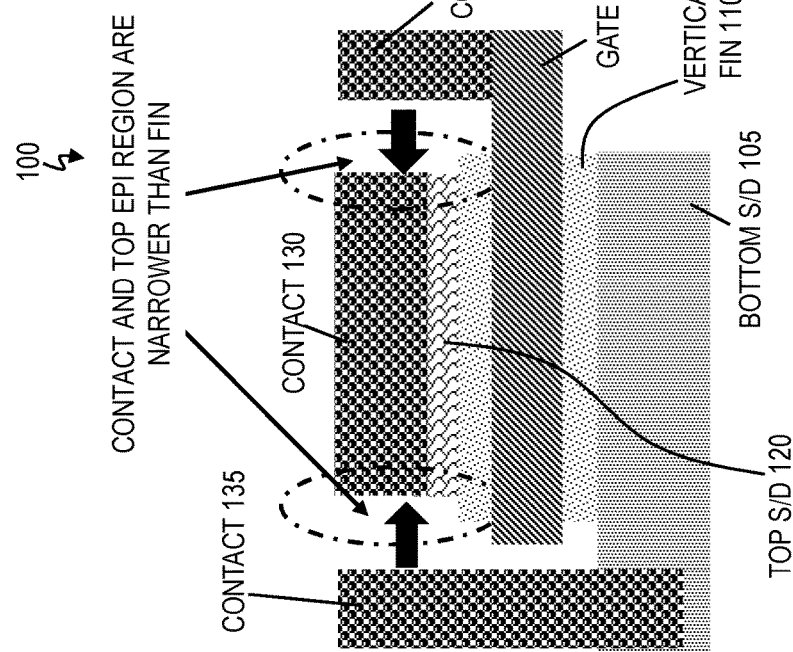
FIG. 1A is a cross-sectional view of a vertical transistor from a perspective according to one or more embodiments.

Now turning to the figures, FIG. 1A is a cross-sectional view of a vertical transistor 100 from one cross-sectional perspective according to one or more embodiments. FIG. 1B is another cross-sectional view of the vertical transistor 100 from a different cross-sectional perspective according to one or more embodiments. FIGS. 1A and 1B are high-level views of the vertical transistor 100.

The vertical transistor 100 includes fins 110 on top of an epitaxial bottom source/drain 105. A gate 115 is formed around the vertical fins 110. A top epitaxial source/drain 120 is formed on top of the fins 110, and a top source/drain contact 130 is formed on top of the fins 110. A gate contact 125 is formed on top of the gate 115, and a bottom source/drain contact 135 is formed on the bottom source/drain 105.

FIG. 1A is a conceptual view illustrating a cross-sectional view cut along one of the vertical fins 110 (i.e., parallel to the fin). In the x-axis, FIG. 1A shows that the width of top source/drain contact 130 and top epitaxial source/drain 120 are narrower than width the vertical fin 110.

FIG. 1B illustrates that the top source/drain contact 130 and top epitaxial source/drain 120 are wider than the vertical fin 110 in the y-axis. There are 3 vertical fins 110 shown in FIG. 1B. It is appreciated that there may be more or fewer vertical fins 110 as desired.

Figure 2:
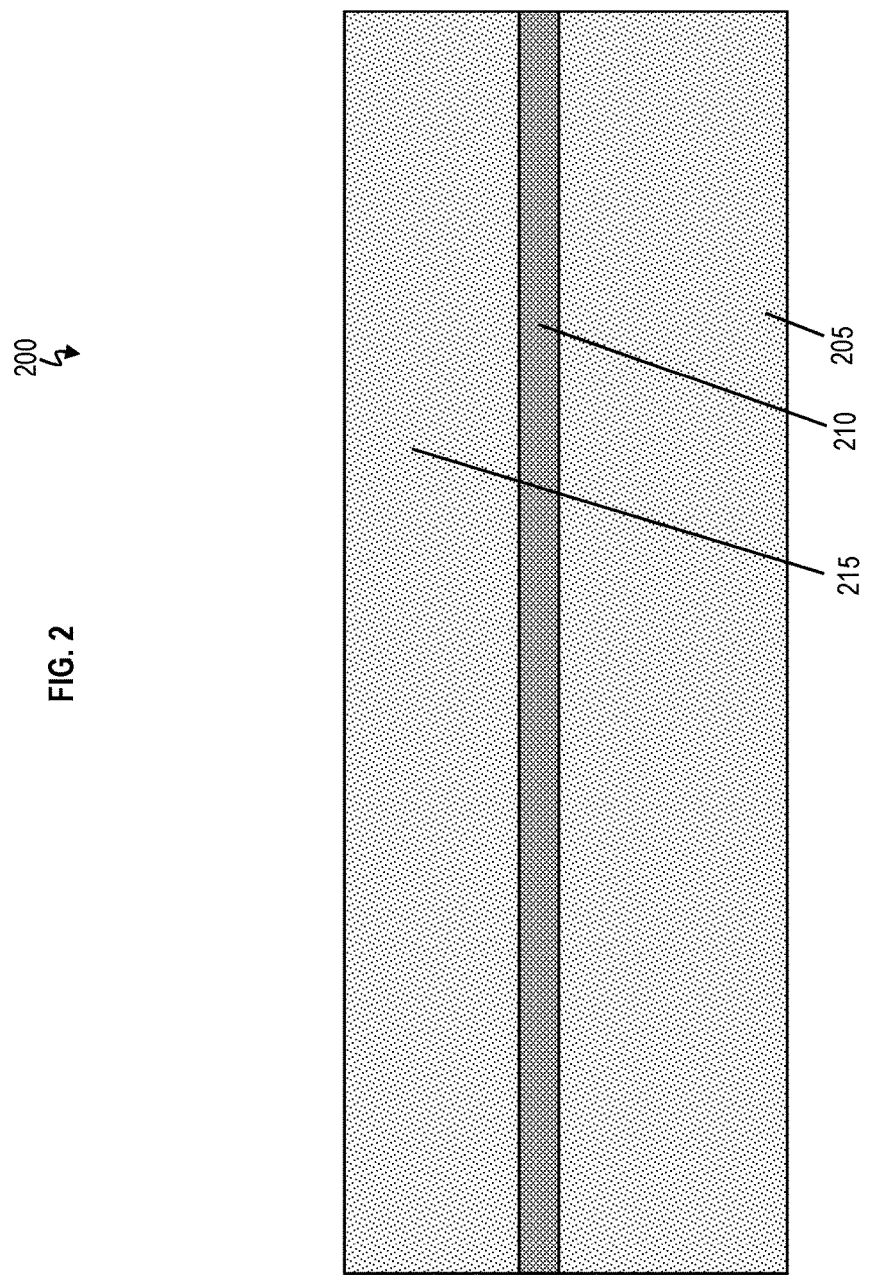
FIG. 2 is a cross-sectional view of an intermediate structure according to one or more embodiments.

A fabrication process is discussed below to build a vertical transistor, such as the vertical transistor 100 discussed above. According to one or more embodiments, it should be appreciated that further details are discussed in FIGS. 2-22. FIG. 2 is a cross-sectional view of an intermediate structure 200 according to one or more embodiments. The intermediate structure 200 includes a substrate 205. The substrate 205 may be a bulk substrate such as Si, SiGe, SiC, etc. Also, the substrate 205 may be a strain relaxed buffer (SRB).

A doped layer 210 is formed on top of the substrate 205. The doped layer 210 may be an epitaxy. The doped epitaxial layer 210 may be doped N+ for building nFET (n-type) or doped P+ for building pFET (p-type). The doped epitaxial layer 210 may be patterned as desired. The doped epitaxial layer 210 results in the bottom source/drain as seen below.

A channel layer 215 is formed on top of the doped layer 210. The channel layer 215 may be non-doped. The channel layer 215 may be Si, SiGe, and/or any group III-V semiconductor material.

Figure 3:
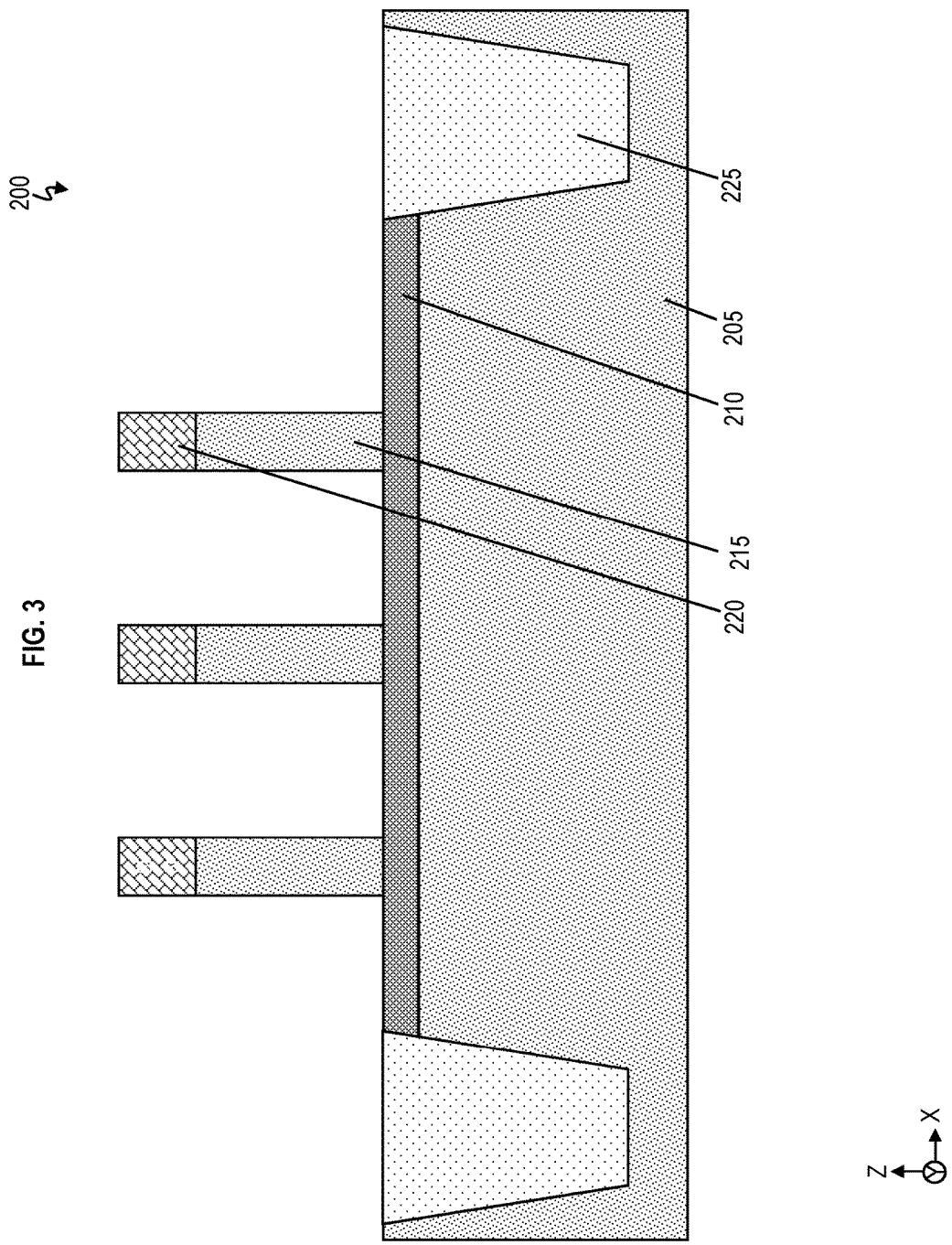
FIG. 3 is a cross-sectional view of the intermediate structure depicting formation of one or more fins according to one or more embodiments.

FIG. 3 is a cross-sectional view of the intermediate structure 200 depicting formation of one or more fins according to one or more embodiments. The channel layer 215 is formed into vertical fins 215 extending in the z-axis. A hard mask 220 is formed on top of the vertical fins 215. In one implementation, the hard mask 220 may be formed on the channel layer 215, and the hard mask 220 may be patterned according to the desired width of the fins 215. The pattern of the hard mask 220 is etched through the channel layer to form the vertical fins 215. In an implementation, the hard mask 220 may be a nitride, such as, SiN.

Also, shallow trench isolation (STI) 225 areas are formed in the substrate 205 on opposite sides of the fins 215. The shallow trench isolation 225 may be formed using standard lithography processes. Forming the shallow trench isolation 225 may include etching a pattern of trenches through the doped layer 210 into the substrate 205, depositing one or more dielectric materials (such as silicon dioxide) to fill the trenches, and removing the excess dielectric.

Figure 4:
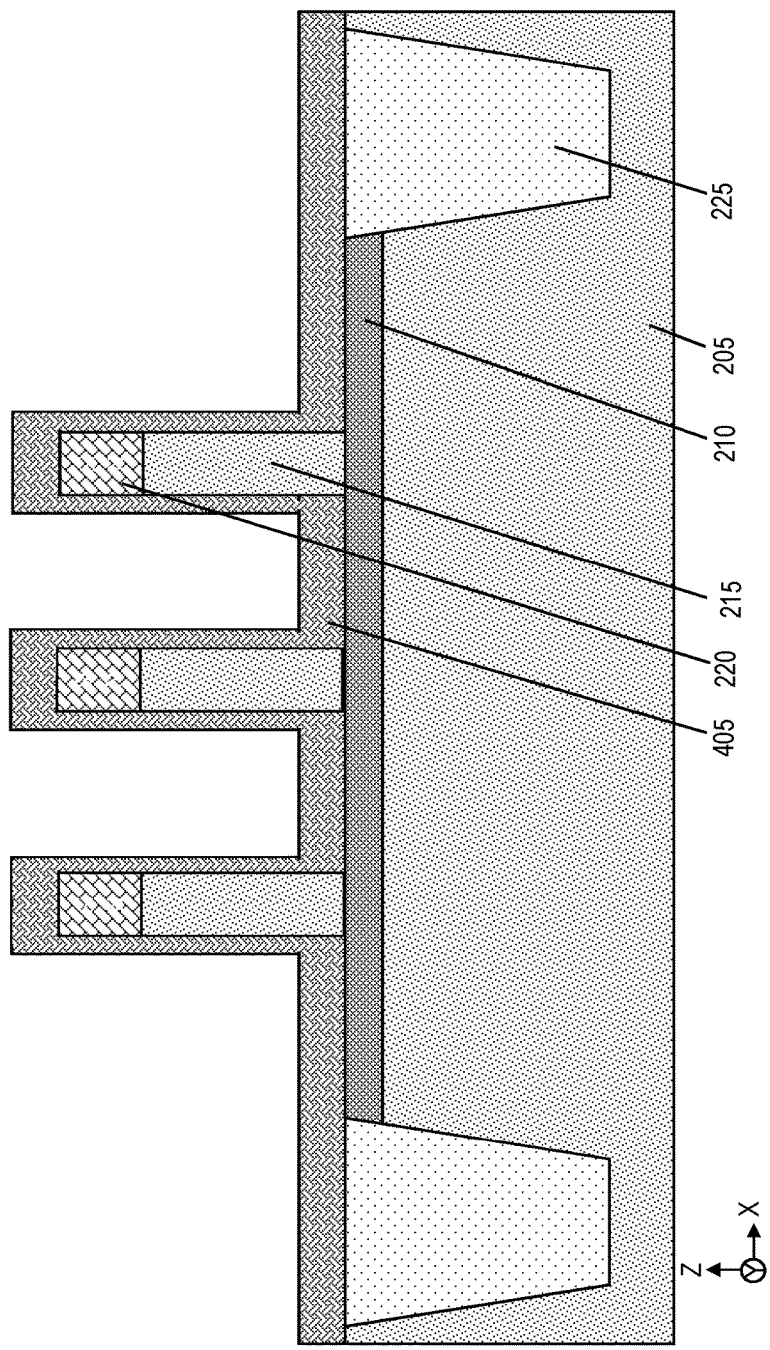
FIG. 4 is a cross-sectional view of the intermediate structure depicting spacer formation according to one or more embodiments.

FIG. 4 is a cross-sectional view of the intermediate structure 200 depicting spacer formation according to one or more embodiments. Spacer material 405 may be deposited on the shallow trench isolation 225, the doped layer 210, the fins 215, and the hard mask 220 using standard lithography processes. Examples of the spacer material 405 may include SiN, oxide, SiBCN, and/or SiOCN. In one implementation, the spacer material 405 may be formed using a high density plasma (HDP) method or a radio frequency plasma CVD (RFPCVD) method in order to result in a thicker bottom layer of spacer material 405 versus a thin side layer of spacer material 405 on the sides of the fins 215 and hard mask 220. The thicker layer of spacer material 405 is on shallow trench isolation 225, the doped layer 210, and the top of the hard mask 220.

Figure 5:
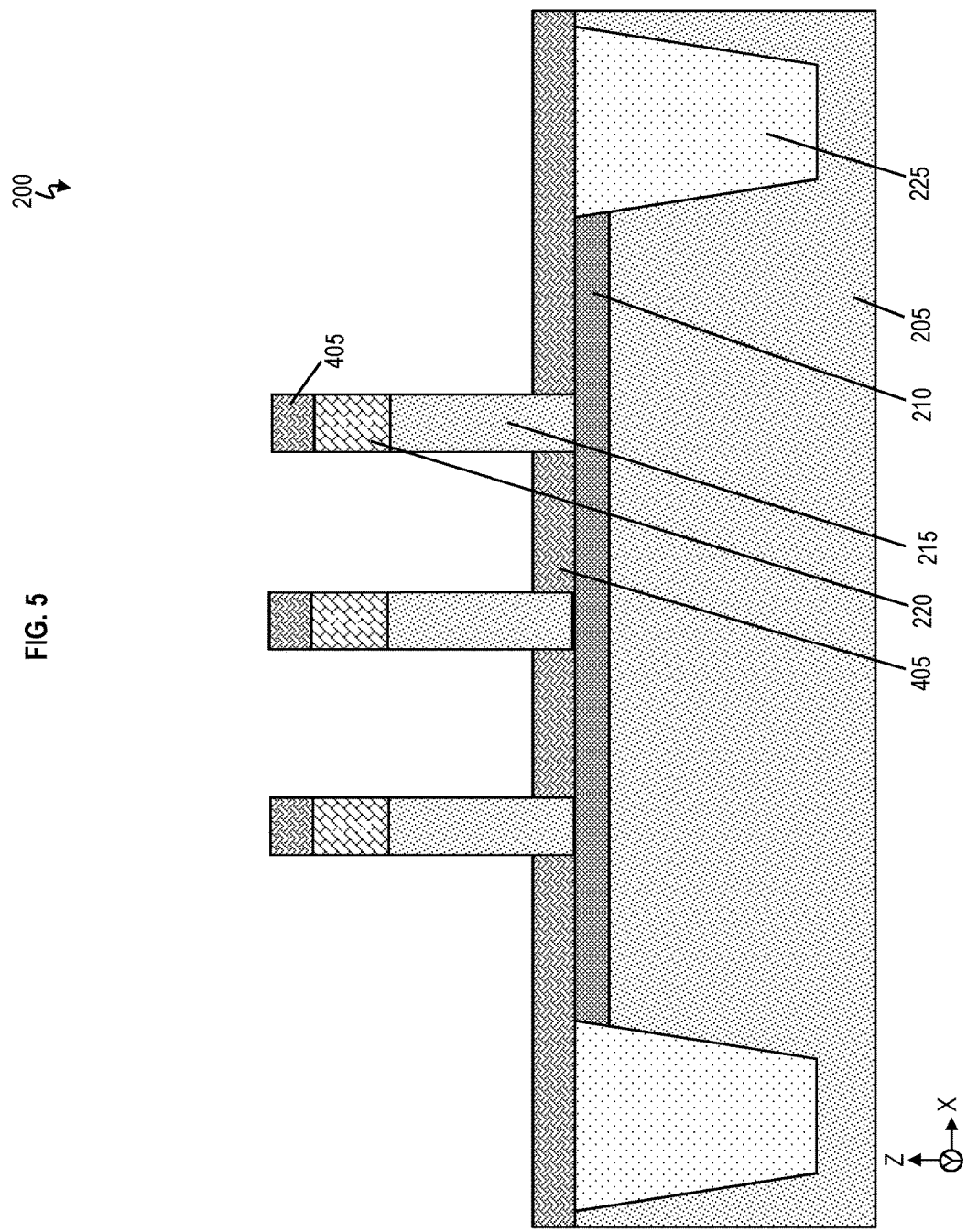
FIG. 5 is a cross-sectional view of the intermediate structure depicting partial removal of spacer material according to one or more embodiments.

FIG. 5 is a cross-sectional view of the intermediate structure 200 depicting partial removal of spacer material 405 according to one or more embodiments. The spacer material 405 is removed from the sides of the fins 215 and hard mask 220, while leaving the spacer material 405 on top of the hard mask 220, the shallow trench isolation 225, and the doped layer 210. Removing the spacer material 405 from the sides of fins 215 and hard mask 220 while leaving the spacer material 405 elsewhere leverages the thickness difference between the sides and bottom layers. In an implementation, an isotropic RIE or wets (for example buffered hydrofluoric acid (BHF) or dilute hydrofluoric acid (DHF)) may be used to etch the spacer material 405.

As an alternative to FIGS. 4 and 5, the spacer material may be deposited to fill the gaps between the fins and even deposited above the fins. The spacer material may be planarized, for example, using chemical mechanical polishing (CMP) and then etched back to leave a bottom layer of spacer material.

Figure 6:
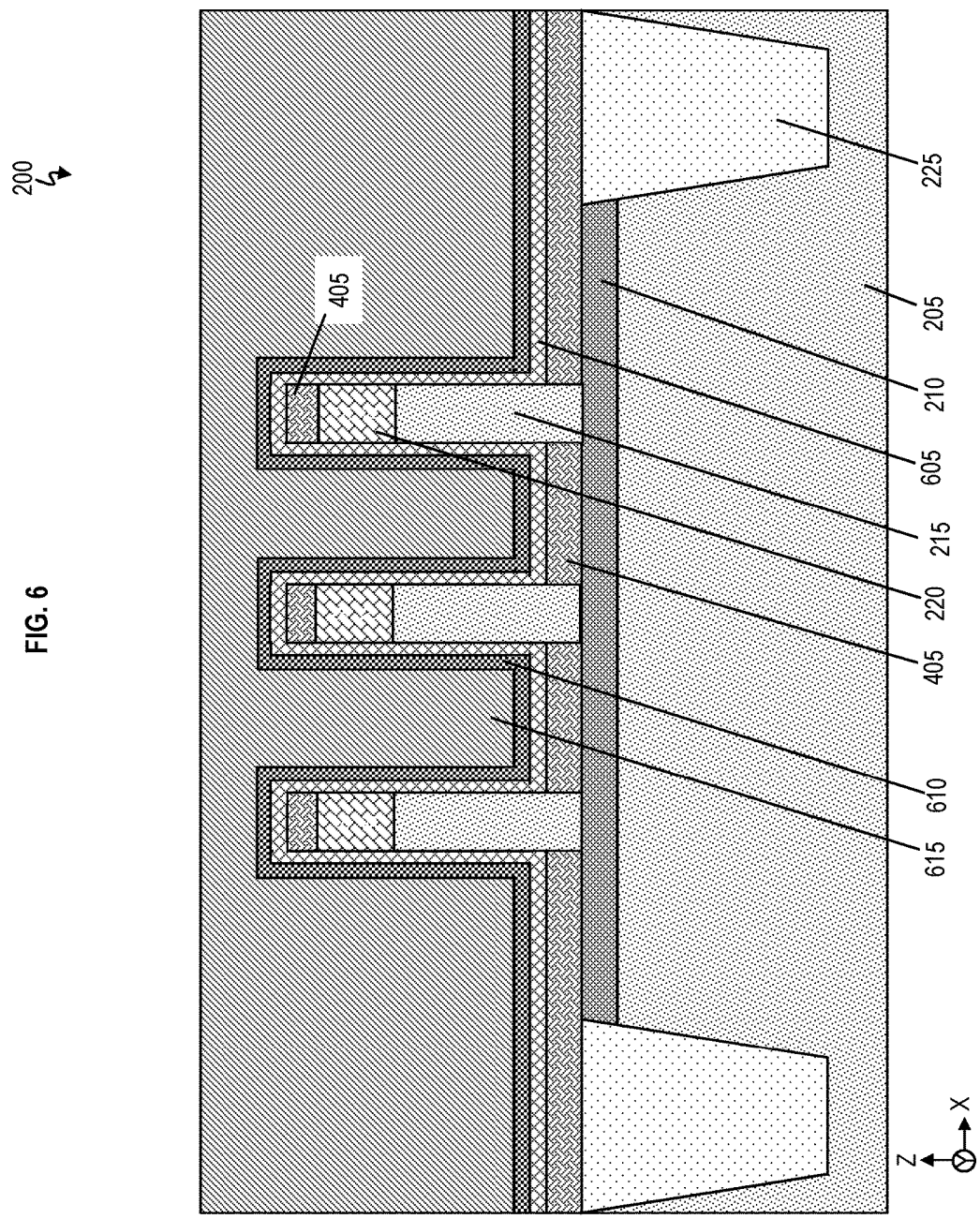
FIG. 6 is a cross-sectional view of the intermediate structure depicting deposition of gate materials according to one or more embodiments.

FIG. 6 is a cross-sectional view of the intermediate structure 200 depicting deposition of gate materials according to one or more embodiments.

A high-k material 605 may be formed on the intermediate structure 200, followed by formation of a work function metal (WFM) layer 610 according to one polarity device (for example nFET or pFET) on the wafer and according to another polarity device (for example nFET or pFET). It is appreciated that an nFET uses one type of WFM and a pFET uses another type of WFM. For example, after the first WFM is formed for one polarity device (for example nFET or pFET), then a lithography patterning process is used to remove the first WFM from the other polarity device area (for example pFET or nFET). Afterward, a second WFM for the other polarity device (for example pFET or nFET) is deposited (not distinguished in figures). Finally, a metal layer 610 (for example W, Co, etc.) is formed for gate contact landing and connection.

Examples of high-k materials include hafnium silicate, zirconium silicate, hafnium dioxide, zirconium dioxide, and so forth. The work function metal layer 610 may be TiN for pFET, and the work function metal layer 610 may be Al doped TiN or TaN, etc., for nFET. The metal layer 615 may be W (or Si).

Figure 7:
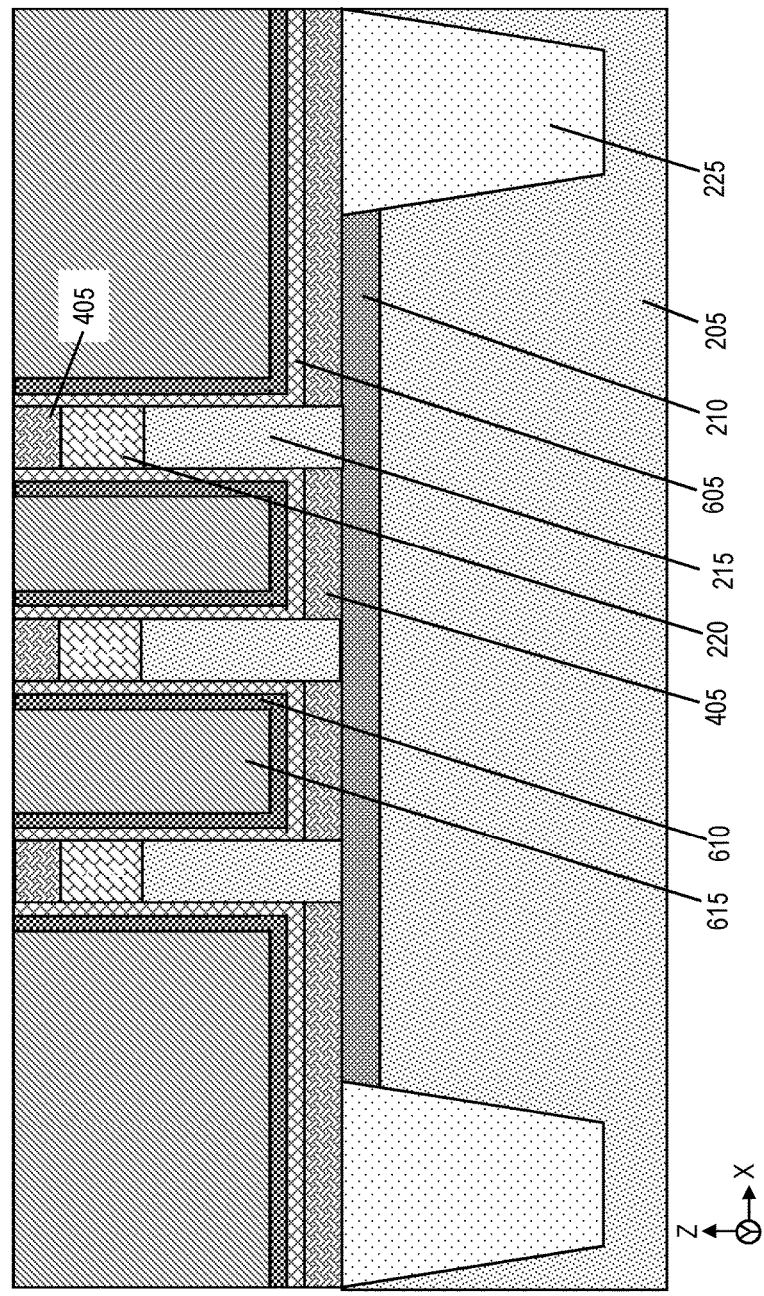
FIG. 7 is a cross-sectional view of the intermediate structure depicting planarization according to one or more embodiments.

FIG. 7 is a cross-sectional view of the intermediate structure 200 depicting planarization according to one or more embodiments. The chemical mechanical polishing stops on the hard mask 220 such that the top of the hard mask 220, the high-k material 605, and work function metal layer 610 are exposed.

Figure 8:
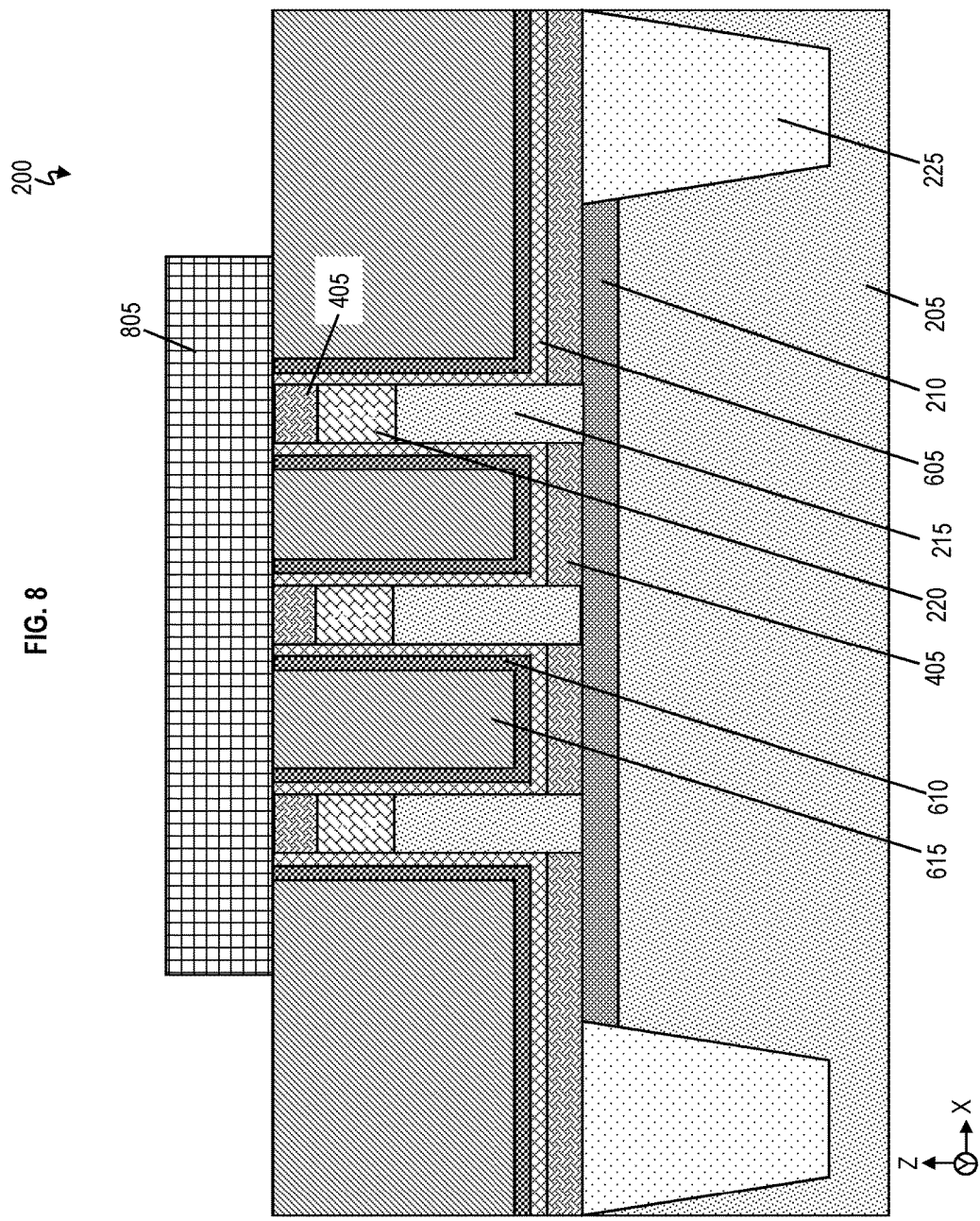
FIG. 8 is a cross-sectional view of the intermediate structure depicting gate patterning according to one or more embodiments.

FIG. 8 is a cross-sectional view of the intermediate structure 200 depicting gate patterning according to one or more embodiments. A mask 805 is deposited to protect the fins 215 and gate materials (including layers 605, 610, 615) in order to etch the unprotected areas where no gate is needed.

Figure 9:
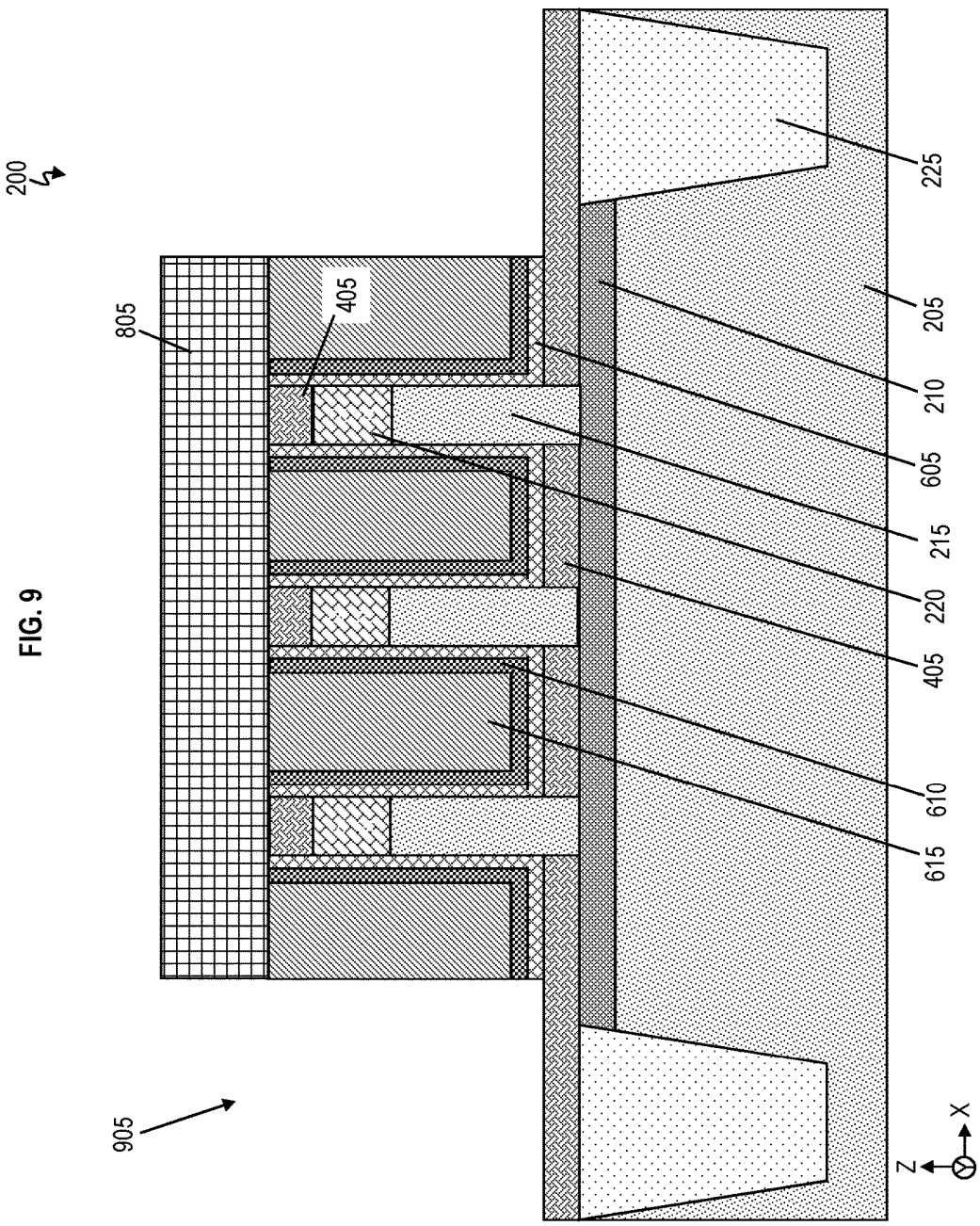
FIG. 9 is a cross-sectional view of the intermediate structure depicting transferring the gate pattern according to one or more embodiments.

FIG. 9 is a cross-sectional view of the intermediate structure 200 depicting transferring the gate pattern according to one or more embodiments. Trenches 905 are formed in the unprotected areas in preparation for gate encapsulation.

Figure 10:
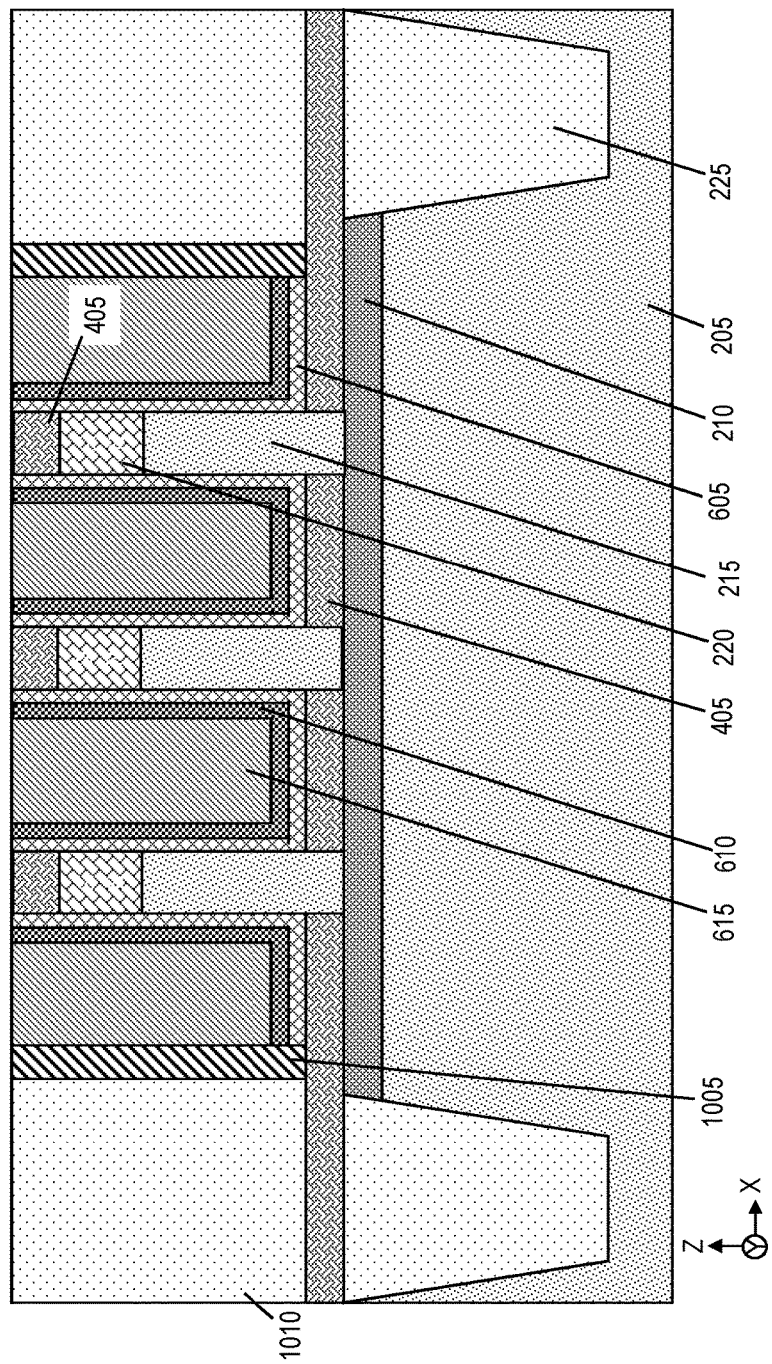
FIG. 10 is a cross-sectional view of the intermediate structure depicting gate encapsulation according to one or more embodiments.

FIG. 10 is a cross-sectional view of the intermediate structure 200 depicting gate encapsulation according to one or more embodiments. A first gate encapsulation layer 1005 is formed on the sides of the high-k material 605, work function metal layer 610, and metal layer 615. A second gate encapsulation layer 1010 is formed on the side of the first gate encapsulation layer 1005. Accordingly, the trench 905 is filled. The mask 805 is removed and the intermediate structure 200 is planarized.

The first gate encapsulation layer 1005 may be a nitride, such as, e.g., SiN. The second gate encapsulation layer 1010 may be an oxide, such as, e.g., $SiO_2$.

Figure 11:
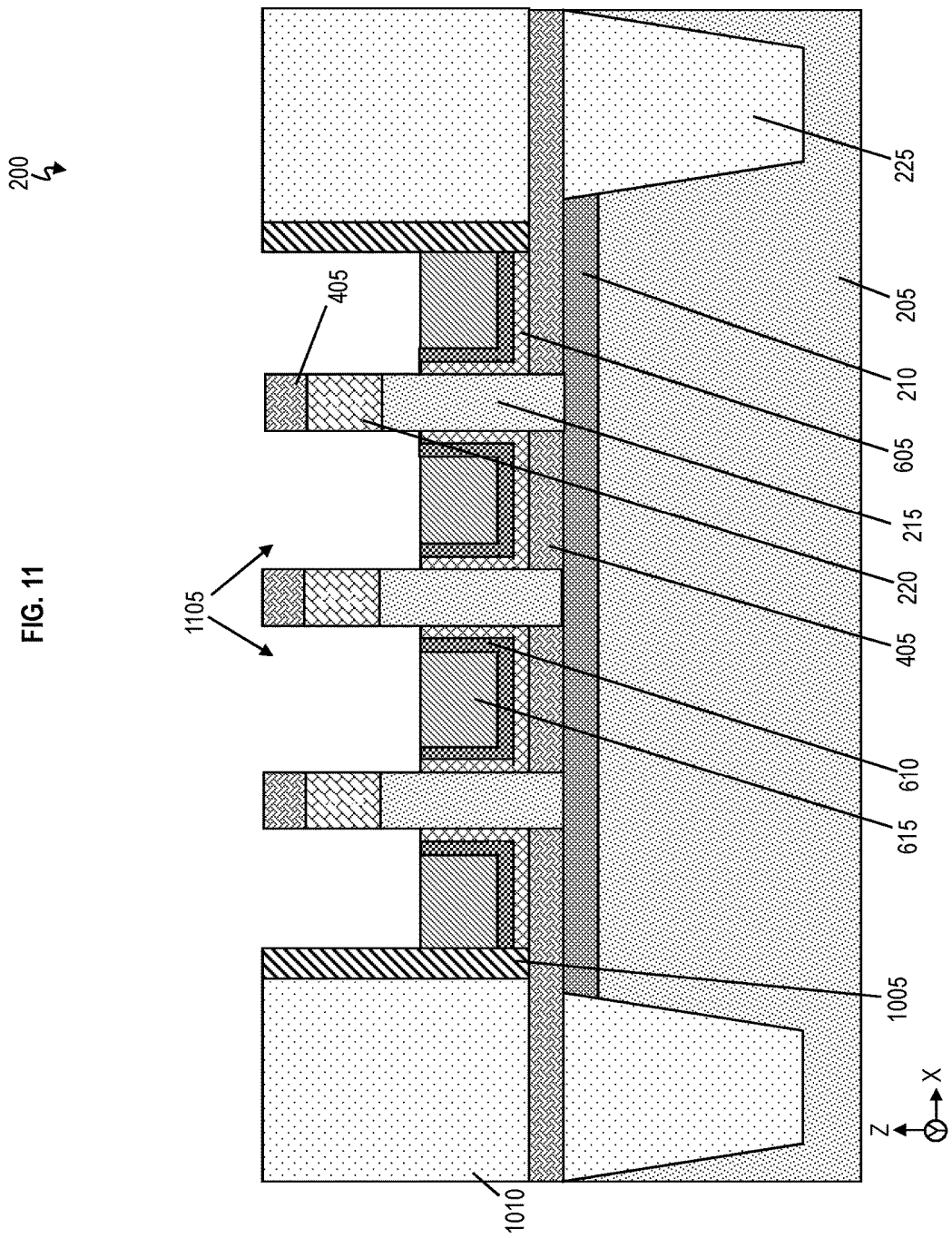
FIG. 11 is a cross-sectional view of the intermediate structure depicting gate recess according to one or more embodiments.

FIG. 11 is a cross-sectional view of the intermediate structure 200 depicting gate recess according to one or more embodiments. The gate materials of the high-k material 605, the WFM layer 610, and the metal gate layer 615 are etched back until they are recessed below the height of the fins 215 in the z-axis. Recessing the layers 605, 610, 615 may be performed using standard lithography processes, and results in trenches 1105.

Figure 12:
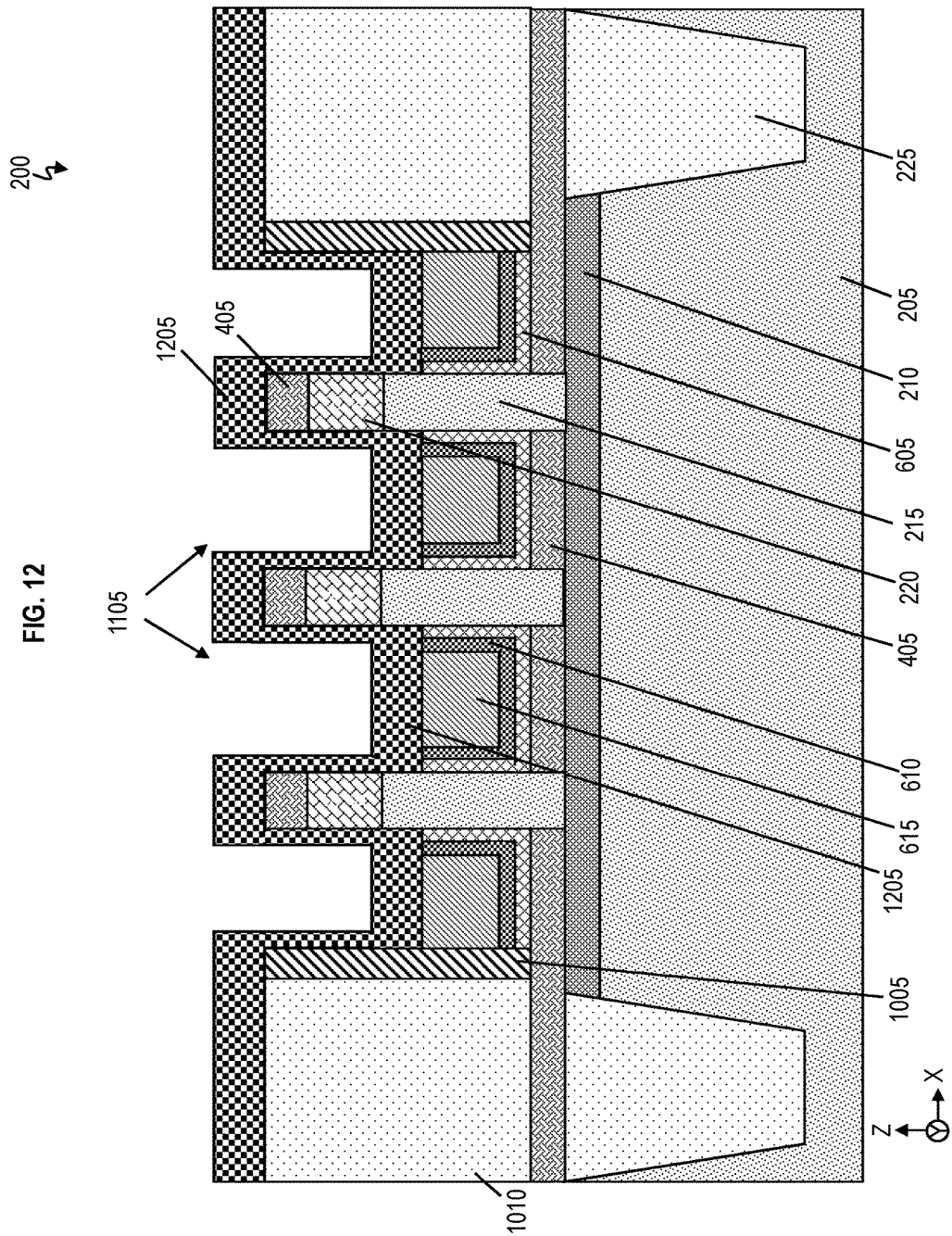
FIG. 12 is a cross-sectional view of the intermediate structure depicting top spacer deposition according to one or more embodiments.

FIG. 12 is a cross-sectional view of the intermediate structure 200 depicting top spacer deposition according to one or more embodiments. Top spacer material 1205 may be formed on top of the intermediate structure 200. Examples of the top spacer material 1205 may include oxides and nitrides (such as, e.g., SiN, SiBCN, SiOCN). The top spacer material 1205 may be a low-k dielectric material.

In one implementation, the top spacer material 1205 may be formed with techniques analogous to forming the spacer material 405. The top spacer material 1205 may be thicker on the bottom layer, such as on top of the gate materials of the high-k material 605, WFM layer 610, and the metal gate layer 615, on top of the first and second gate encapsulation layers 1005, 1010, and on top of the spacer material 405. The top spacer material 1205 may be thinner on the sides, such as on the sides of the first gate encapsulation layer 1005, sides of the hard mask 220, and sides of the fins 215.

Figure 13:
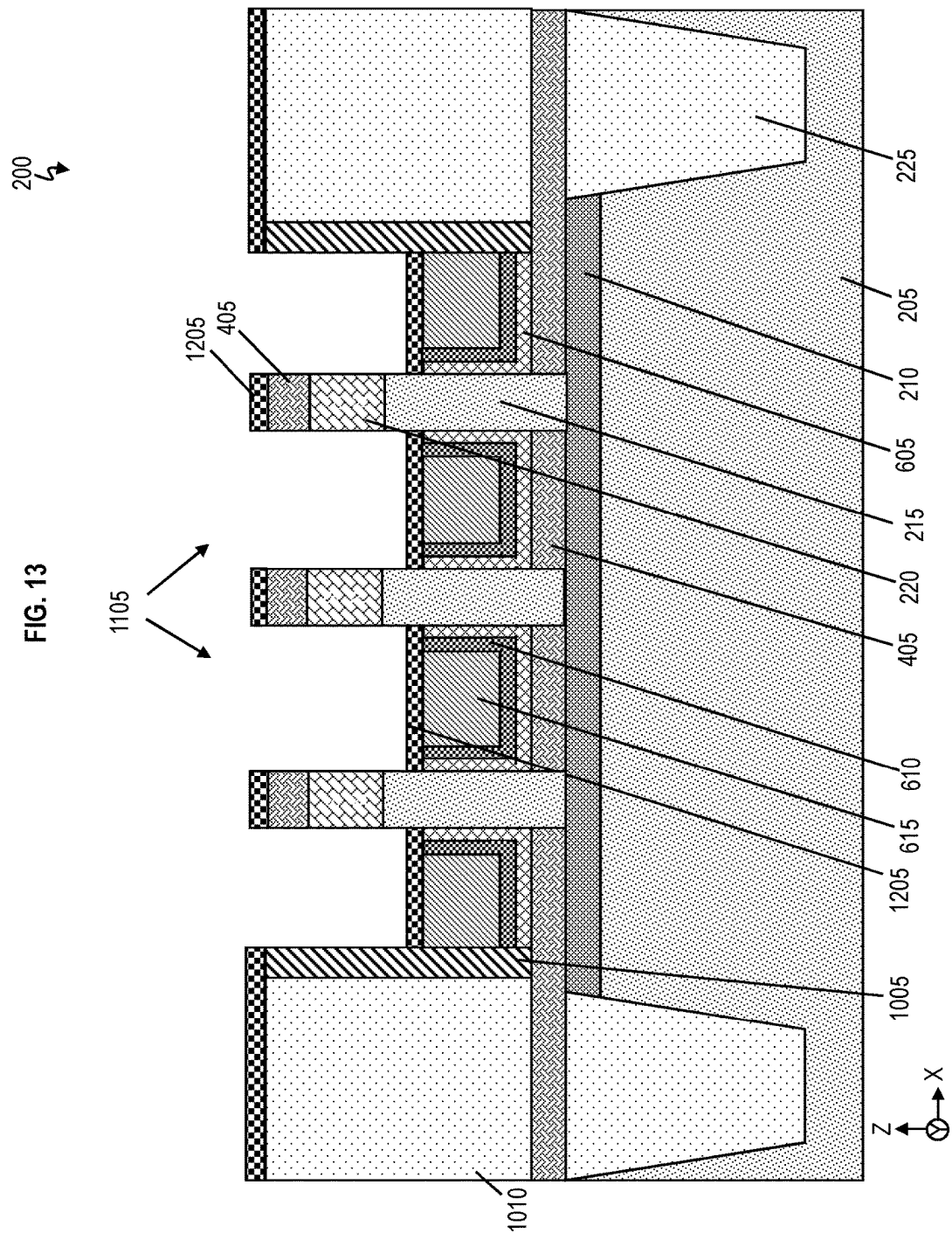
FIG. 13 is a cross-sectional view of the intermediate structure depicting partial removal of the top spacer material according to one or more embodiments.

FIG. 13 is a cross-sectional view of the intermediate structure 200 depicting partial removal of the top spacer material 1205 according to one or more embodiments. The top spacer material 1205 is removed from the sides of the first gate encapsulation layer 1005, hard mask 220, and the fins 215, while leaving the top spacer material 1205 on top of the high-k material 605, the WFM layer 610, the metal gate layer 615, the first and second gate encapsulation layers 1005, 1010, and the spacer material 405. Removing the top spacer material 1205 from the sides of the first gate encapsulation layer 1005, hard mask 220, and the fins 215 while leaving the top spacer material 1205 elsewhere leverages the thickness difference between the sides and bottom layers. In one implementation, an isotropic RIE or wet etch may be used to etch the spacer material 1205.

Figure 14:
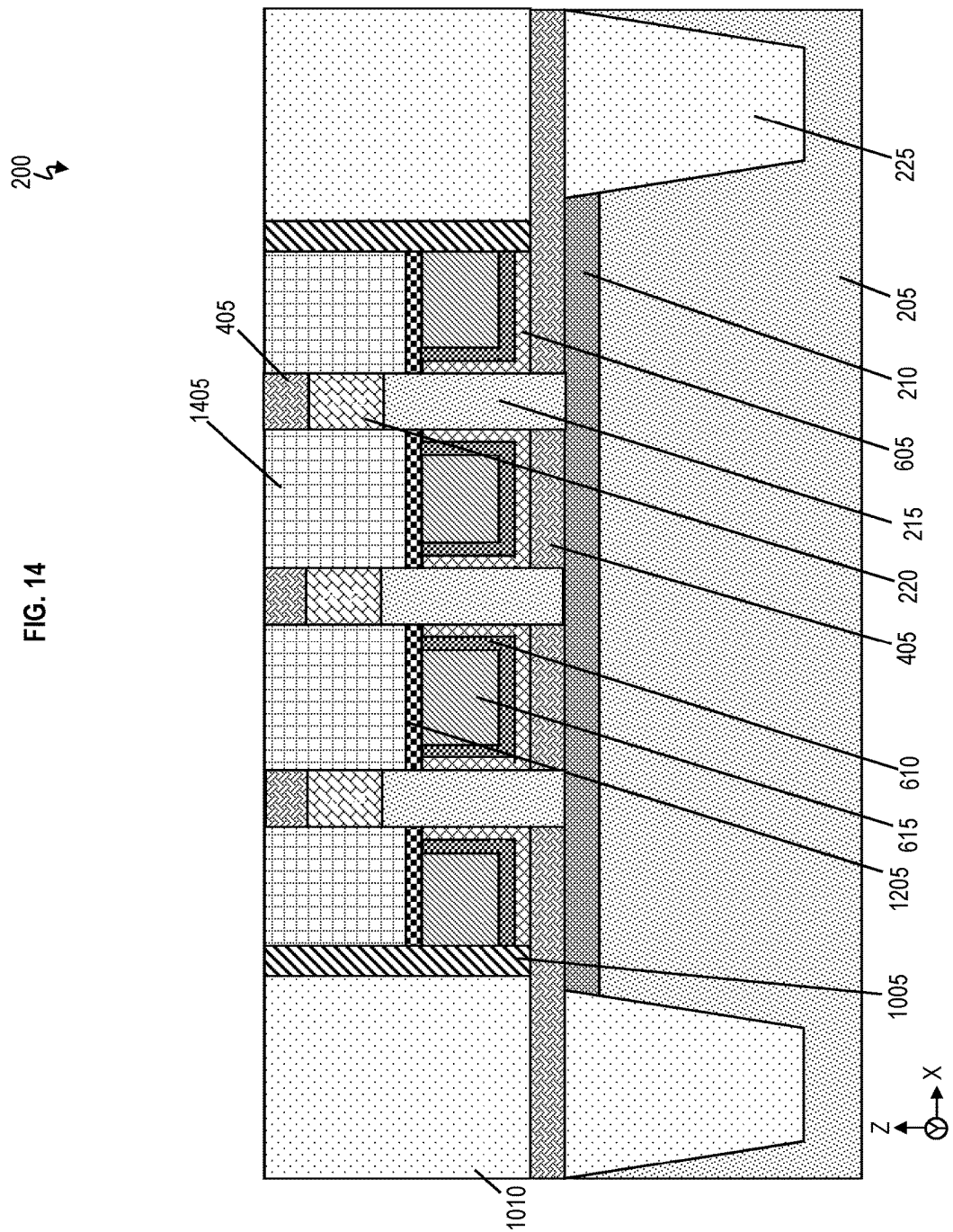
FIG. 14 is a cross-sectional view of the intermediate structure depicting deposition of a filling material according to one or more embodiments.

FIG. 14 is a cross-sectional view of the intermediate structure 200 depicting deposition of a filling material according to one or more embodiments. A filling material 1405 may be formed in the trenches 1105 (of FIGS. 11-13) and the top spacer material 1205 is removed from on top of the first and second gate encapsulation layers 1005, 1010 and the spacer material 405. The top spacer material 1205 remains on top of the high-k material 605, the WFM layer 610, and the metal gate layer 615. The intermediate structure 200 is planarized. In one implementation, the filling material 1405 may be an oxide.

Figure 15:
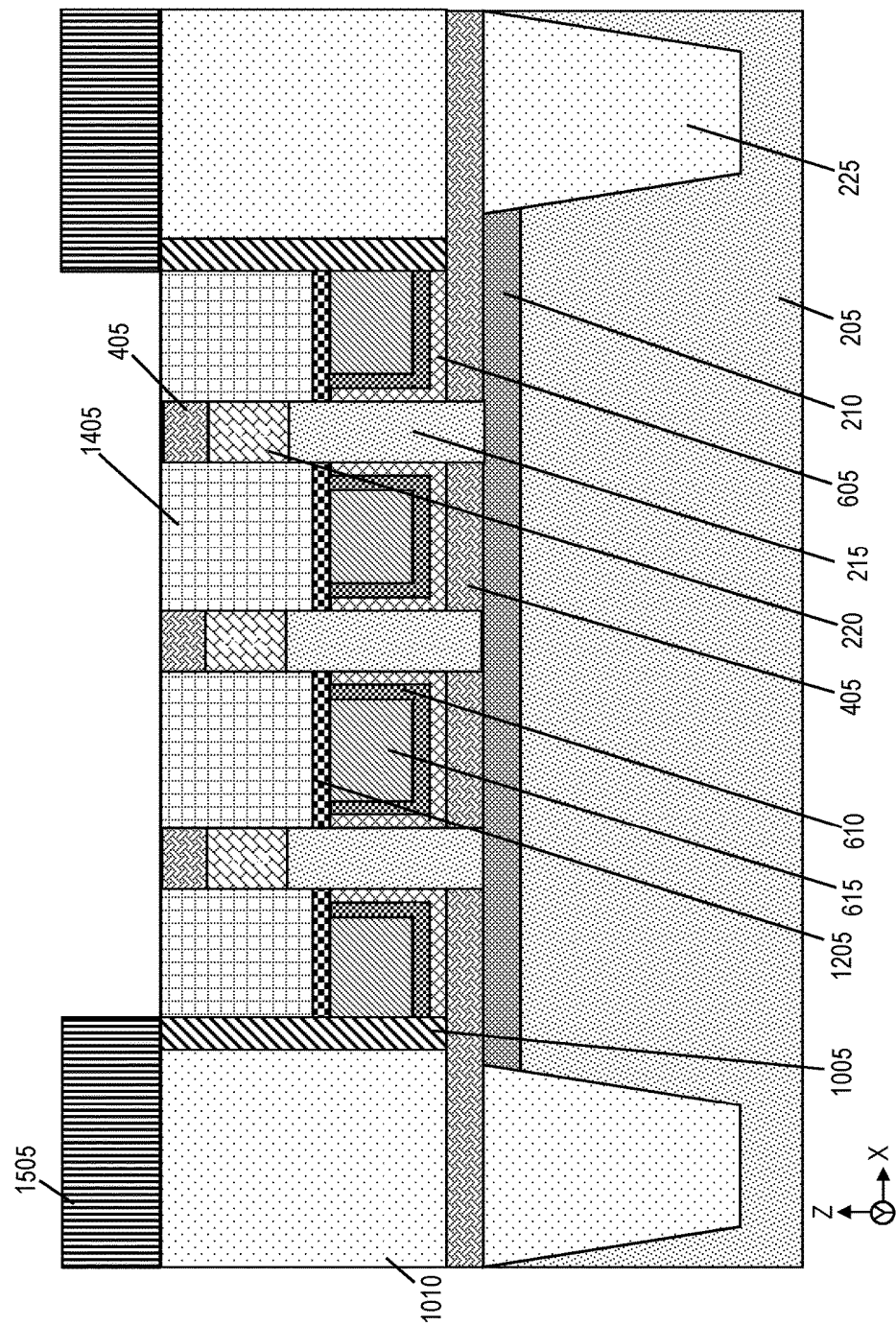
FIG. 15 is a cross-sectional view of the intermediate structure depicting a patterned mask according to one or more embodiments.

FIG. 15 is a cross-sectional view of the intermediate structure 200 depicting a mask 1505 according to one or more embodiments. The mask 1505 is deposited and patterned on intermediate structure 200. The pattern of mask 1505 is formed on top of the first and second encapsulation layers 1005 and 1010. The mask 1505 may be a photoresist mask.

Figure 16:
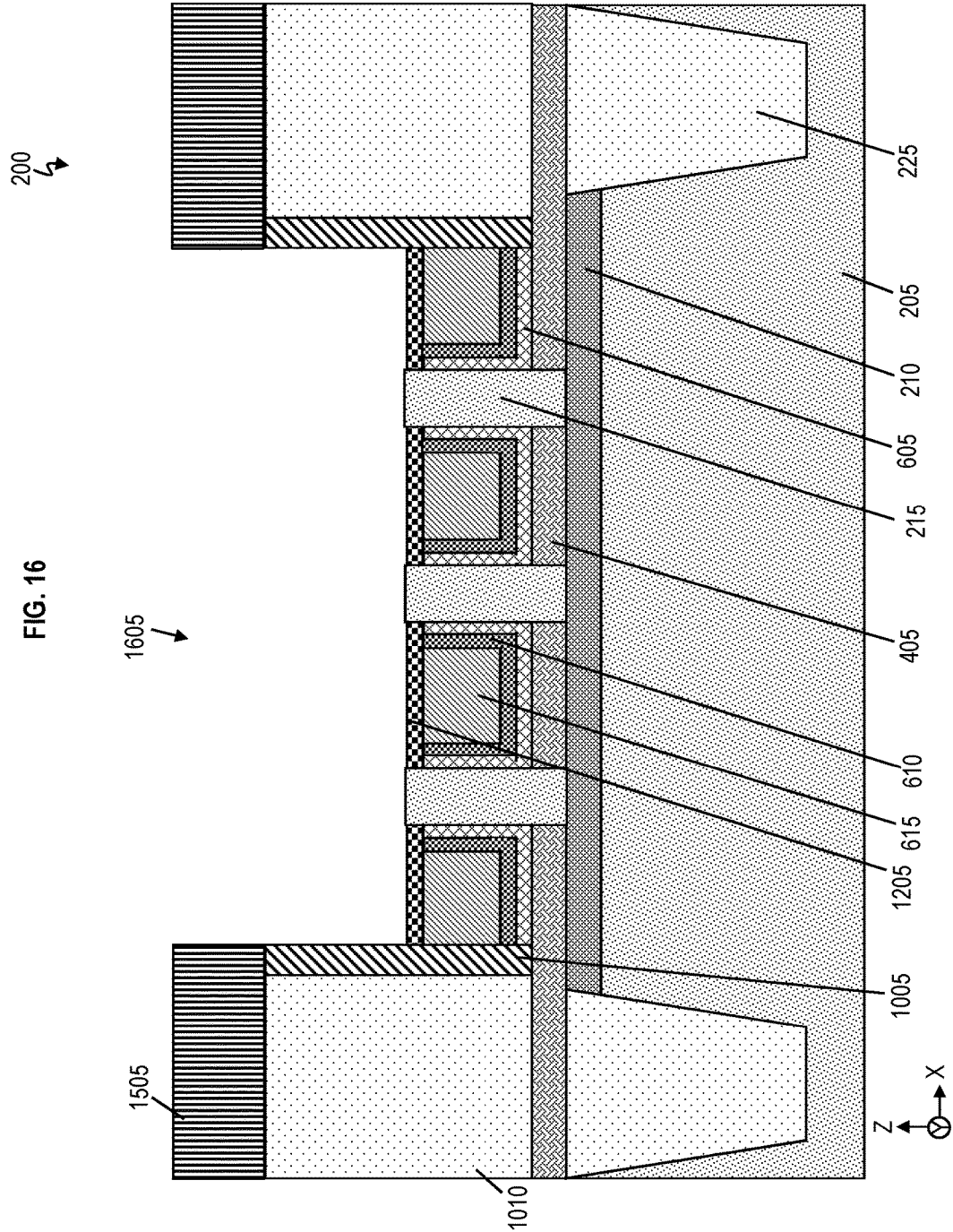
FIG. 16 is a cross-sectional view of the intermediate structure depicting removing material to form a confinement trench according to one or more embodiments.

FIG. 16 is a cross-sectional view of the intermediate structure 200 depicting removing material not covered by mask 1505 according to one or more embodiments. The spacer material 405, hard mask 220, filling material 1405, and upper portion of fins 215 are removed, thereby forming confinement trench 1605. The confinement trench 1605 is opened above the 3 fins 215. The etching stops at the top spacer material 1205 in the confinement trench 1605. The top of the fins 215 is substantially level or coplanar with the top of the top spacer material 1205.

Figure 17A:
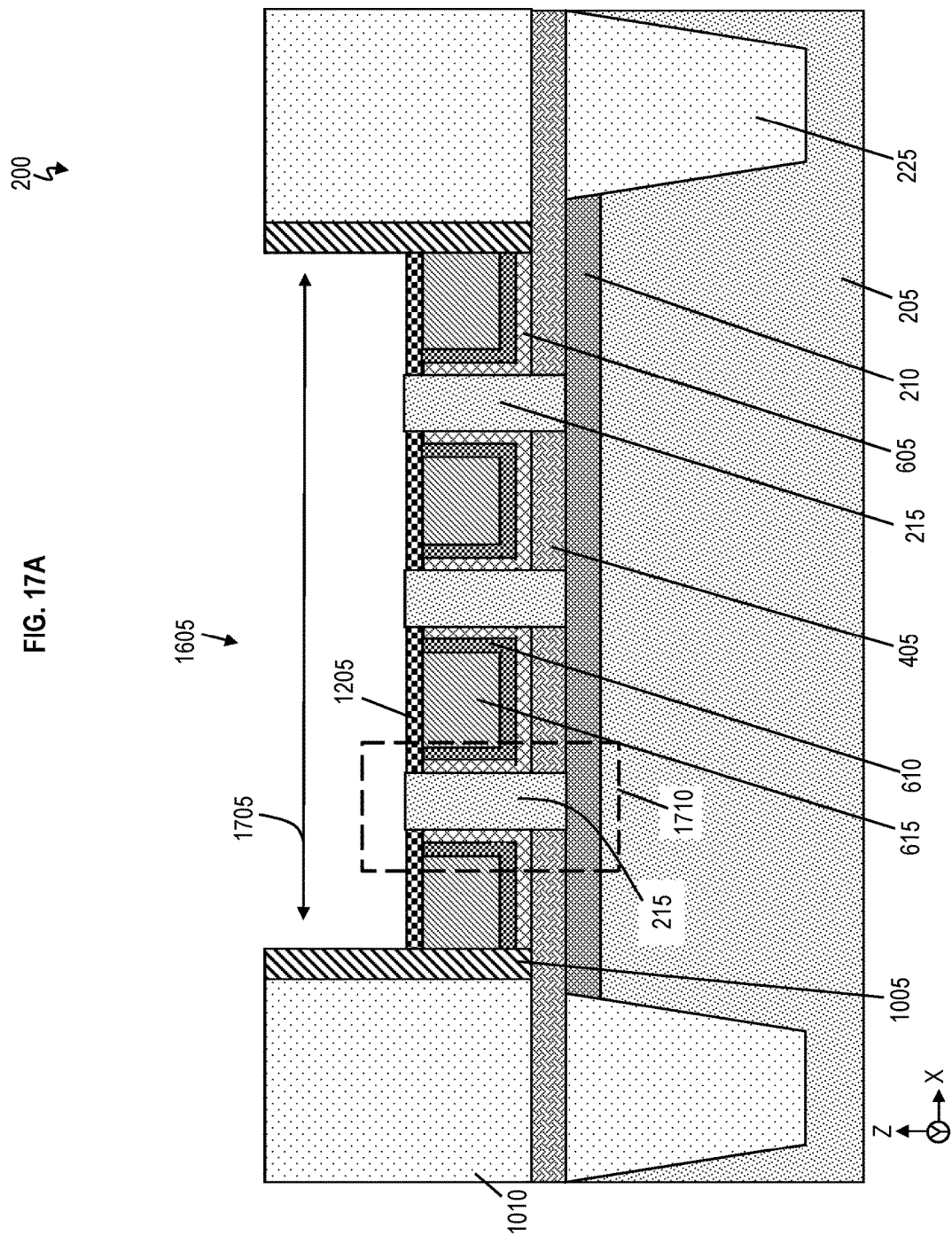
FIG. 17A is a cross-sectional view of the intermediate structure depicting the confinement trench after removal of the mask according to one or more embodiments.

FIG. 17A is a cross-sectional view of the intermediate structure 200 depicting the confinement trench 1605 after removal of the mask 1505 according to one or more embodiments. The confinement trench 1605 has a first lateral dimension 1705 along the x-axis. The confinement trench 1605 extends from the sidewall of one first encapsulation layer 1005 to the sidewall of the other first encapsulation layer 1005, and the first lateral dimension 1705 is measured in the x-axis from these two sidewalls of the first encapsulation layer 1005.

Figure 17B:
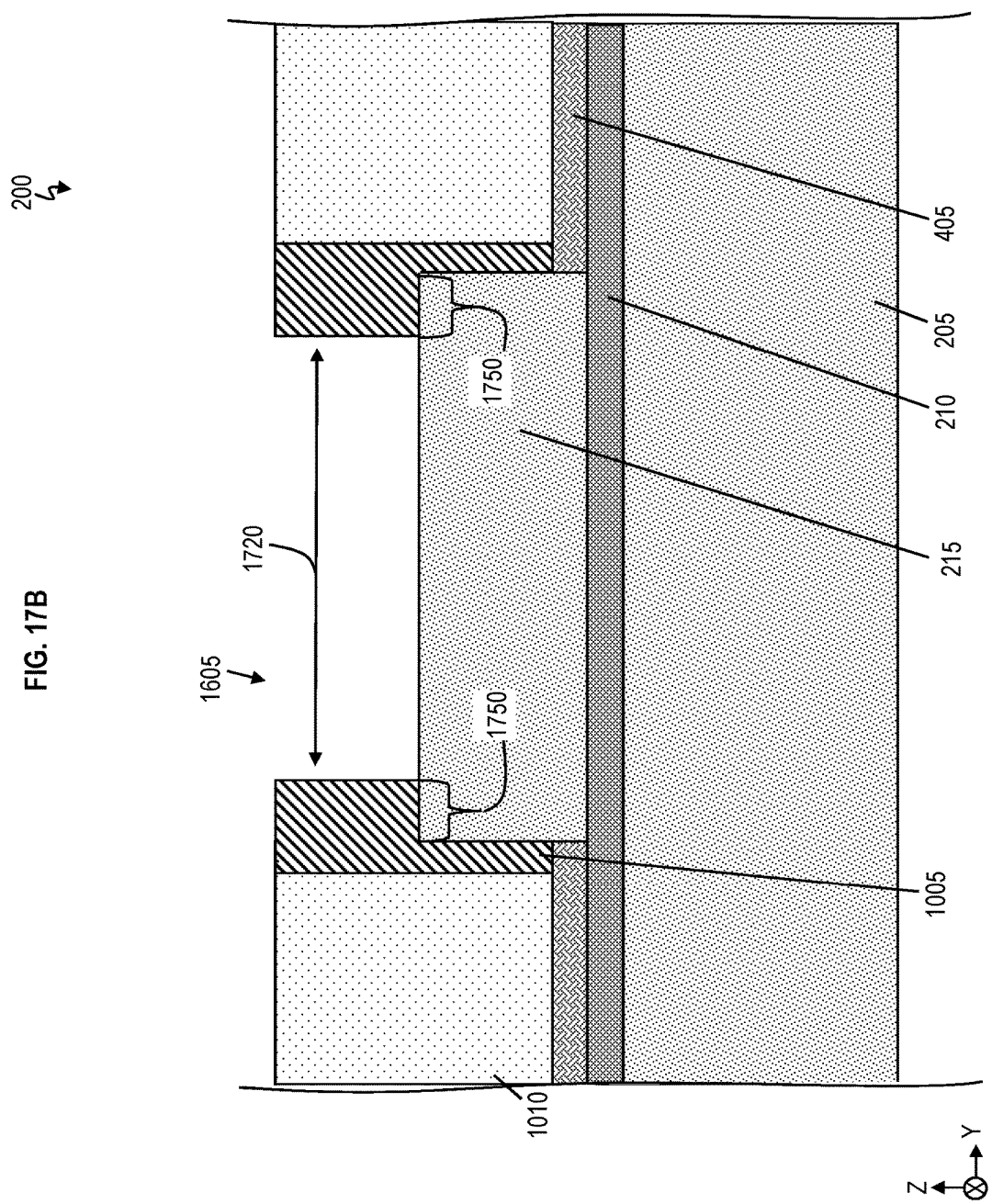
FIG. 17B is another cross-sectional view of the intermediate structure depicting the confinement trench with respect to another lateral dimension according to one or more embodiments.

The first lateral dimension 1705 is perpendicular to the fins 215. A dashed rectangular box 1710 highlights one of the fins 215 in order to illustrate that another cross-sectional view will be taken parallel to the fin 215 along the y-axis. Accordingly, FIG. 17B is another cross-sectional view of the intermediate structure 200 depicting the confinement trench 1605 in a second lateral dimension 1720 taken along the y-axis through one of the fins 215 according to one or more embodiments. FIG. 17B is taken from a perspective parallel to a single fin 215, such as the highlighted fin 215 in the rectangular box 1710 of FIG. 17A.

In FIG. 17B, the confinement trench 1605 has the second lateral dimension 1720 along the y-axis. The confinement trench 1605 extends from the sidewall of one first encapsulation layer 1005 to the sidewall of the other first encapsulation layer 1005, and the second lateral dimension 1720 is measured in the y-axis from these two sidewalls of the first encapsulation layer 1005.

The second lateral dimension 1720 measured in the y-axis is greater than the first lateral dimension 1705 measured in the x-axis (in FIG. 17A). In one implementation, the first lateral dimension 1705 may range from about 10-500 nm, and the second lateral dimension 1720 may range from about 10-200 nm.

The first and second lateral dimensions 1705 and 1720 of confinement trench 1605 are in the same plane. The first and second lateral dimensions 1705 and 1720 are substantially at right angles to one another in the same plane, while both the first and second lateral dimensions 1705 and 1720 (x and y-axes) are perpendicular to the height (in the z-axis) of the intermediate structure 200.

The confinement trench 1605 has extended portions 1750 of the first encapsulation layer 1005. The extended portions 1750 contribute to the second lateral dimension 1720 in the y-axis.

Figure 18A:
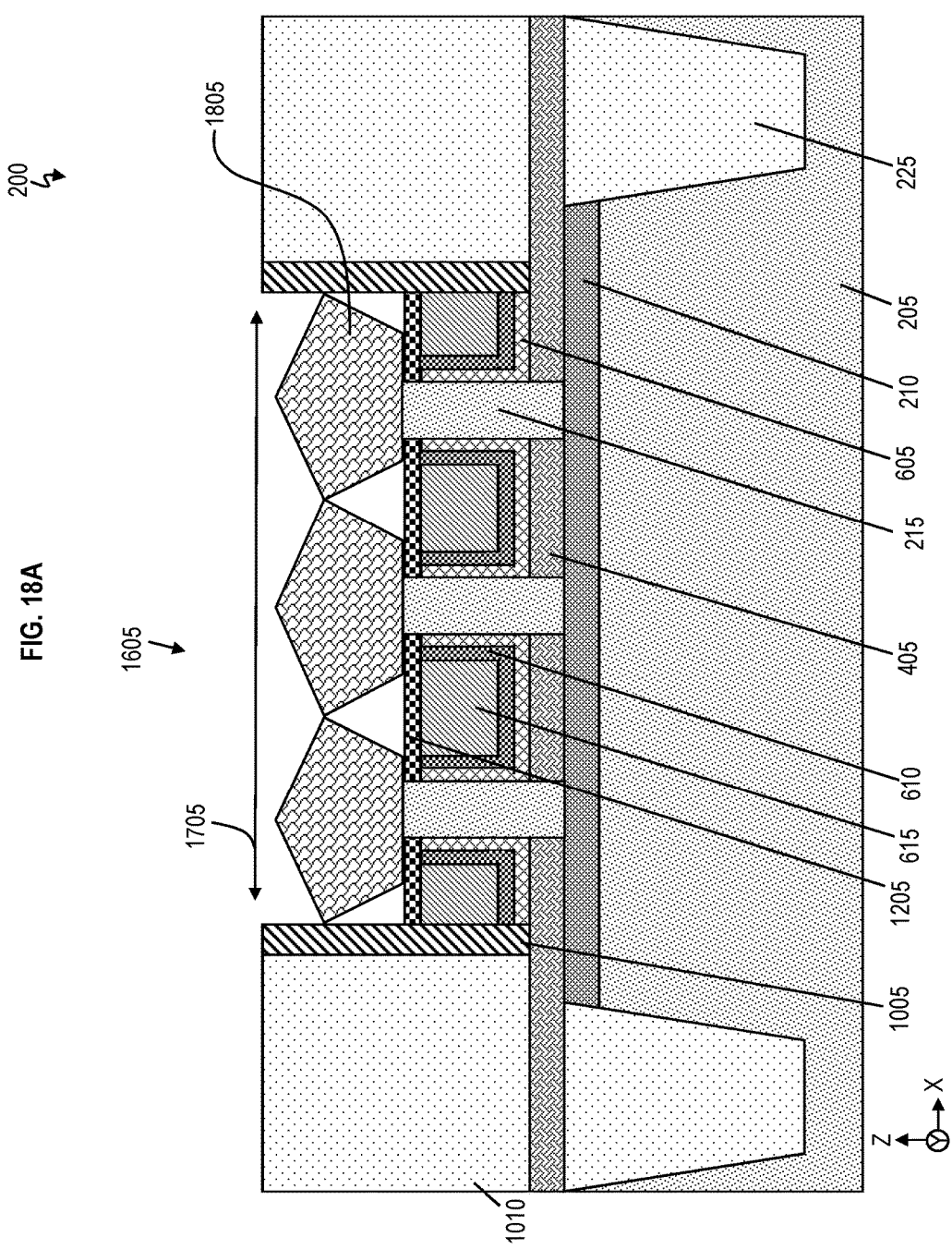
FIG. 18A is a cross-sectional view of the intermediate structure depicting epitaxial growth in the confinement trench according to one or more embodiments.

FIG. 18A is a cross-sectional view of the intermediate structure 200 depicting epitaxial growth in the confinement trench 1605 according to one or more embodiments. An epitaxial top source/drain 1805 may be formed by the growth of the epitaxy according to each of the fins 215.

An nFET or pFET epitaxial layer can be formed by using block level patterning. For an nFET, the epitaxial top source/drain 1805 may be doped with an n-type dopant, such as, e.g., As or P, and the epitaxial layer may be Si, SiC, etc. For a pFET, the epitaxial top source/drain 1805 may be doped with a p-type dopant, such as, e.g., B, and the epitaxial layer may be SiGe, Si, etc.

The growth of the epitaxial top source/drain 1805 is laterally confined in the x-axis by the first lateral dimension 1705 of the confinement trench 1605. Also, the growth of the top source/drain 1805 from each fin 215 is laterally confined by the epitaxial layer of its neighboring fin 215. The fins 215 on the ends are also confined by (and touch) the sidewalls of the first encapsulation layer 1005.

Figure 18B:
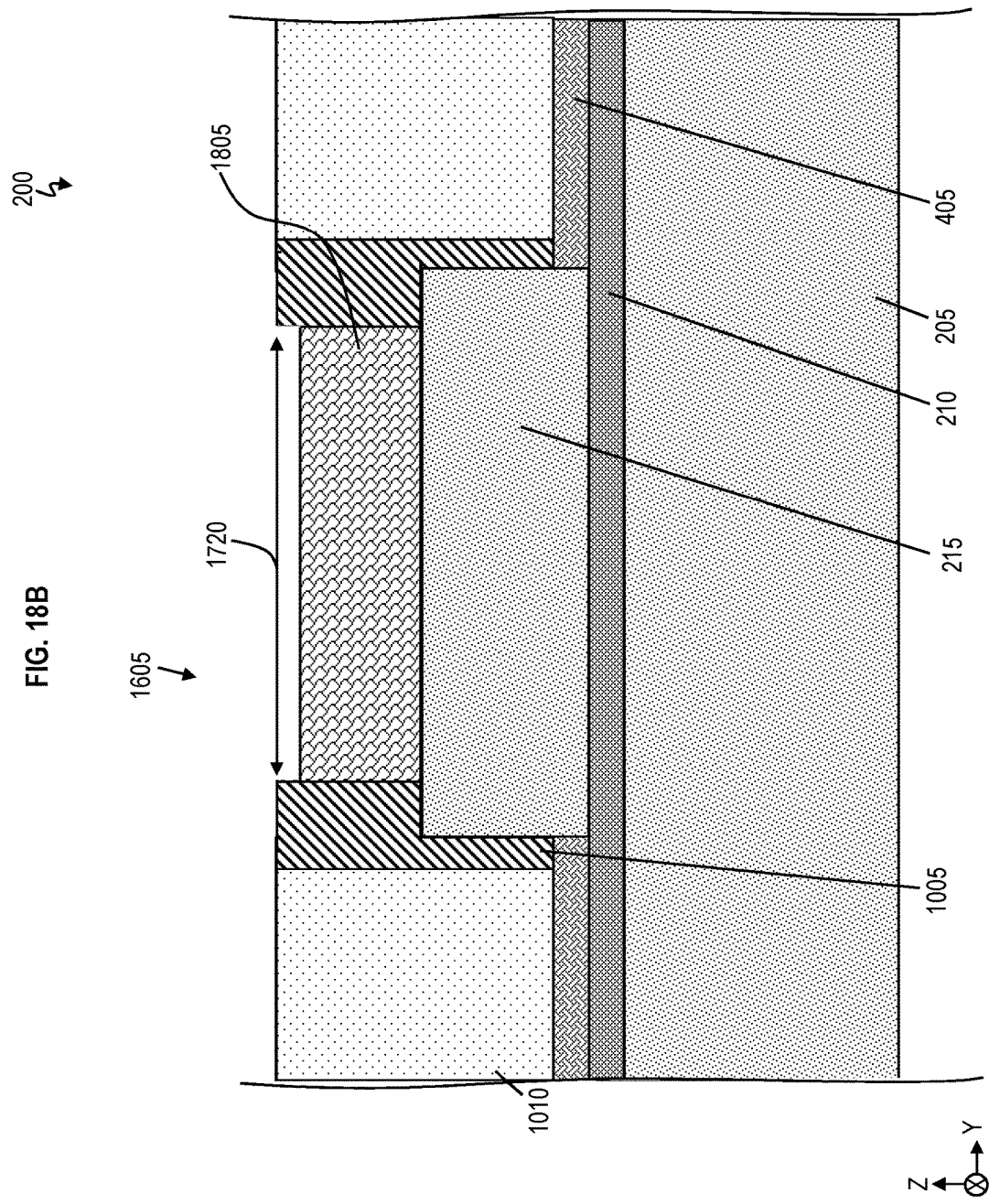
FIG. 18B is another cross-sectional view of the intermediate structure depicting epitaxial growth in the confinement trench according to one or more embodiments.

FIG. 18B is another cross-sectional view of the intermediate structure 200 depicting epitaxial growth in the confinement trench 1605 according to one or more embodiments. The top source/drain 1805 is formed by the growth of the epitaxy according to each of the fins 215, and the growth of the epitaxial top source/drain 1805 is laterally confined in the y-axis by the second lateral dimension 1720 of the confinement trench 1605. The growth of the top source/drain 1805 for each fin 215 is laterally confined by (and touch) the sidewalls of the first encapsulation layer 1005 in the y-axis. In the y-axis, the width of the top source/drain 1805 is reduced by the extended portions 1750 of the first encapsulation layer 1005. As such, the width of the each individual epitaxial top source/drain 1805 is smaller than the width of the individual fin 215 in the y-axis. This avoids potential shorting to the gate contact and bottom source/drain contact. As noted above, the cross-sectional view in FIG. 18B is parallel to one of the fins 215.

Figure 19:
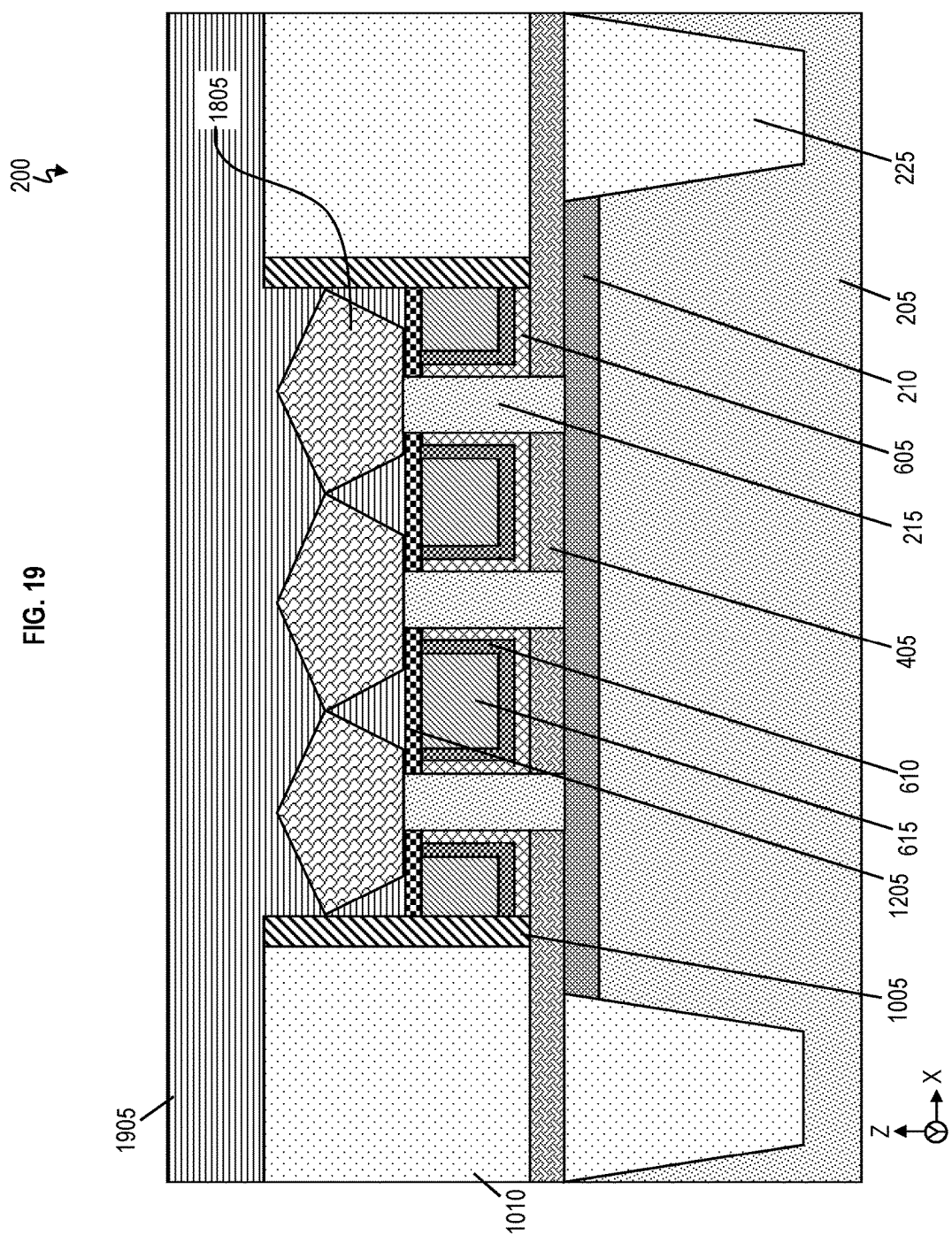
FIG. 19 is a cross-sectional view of the intermediate structure depicting deposition of a filling material according to one or more embodiments.

FIG. 19 is a cross-sectional view of the intermediate structure 200 depicting deposition of a filling material 1905 according to one or more embodiments. Filling material 1905 is deposited on the intermediate structure 200, which fills the confinement trench 1605. The filling material 1905 may an interlayer dielectric (ILD) material. The interlayer dielectric material may be silicon oxide or a low-k material.

Figure 20:
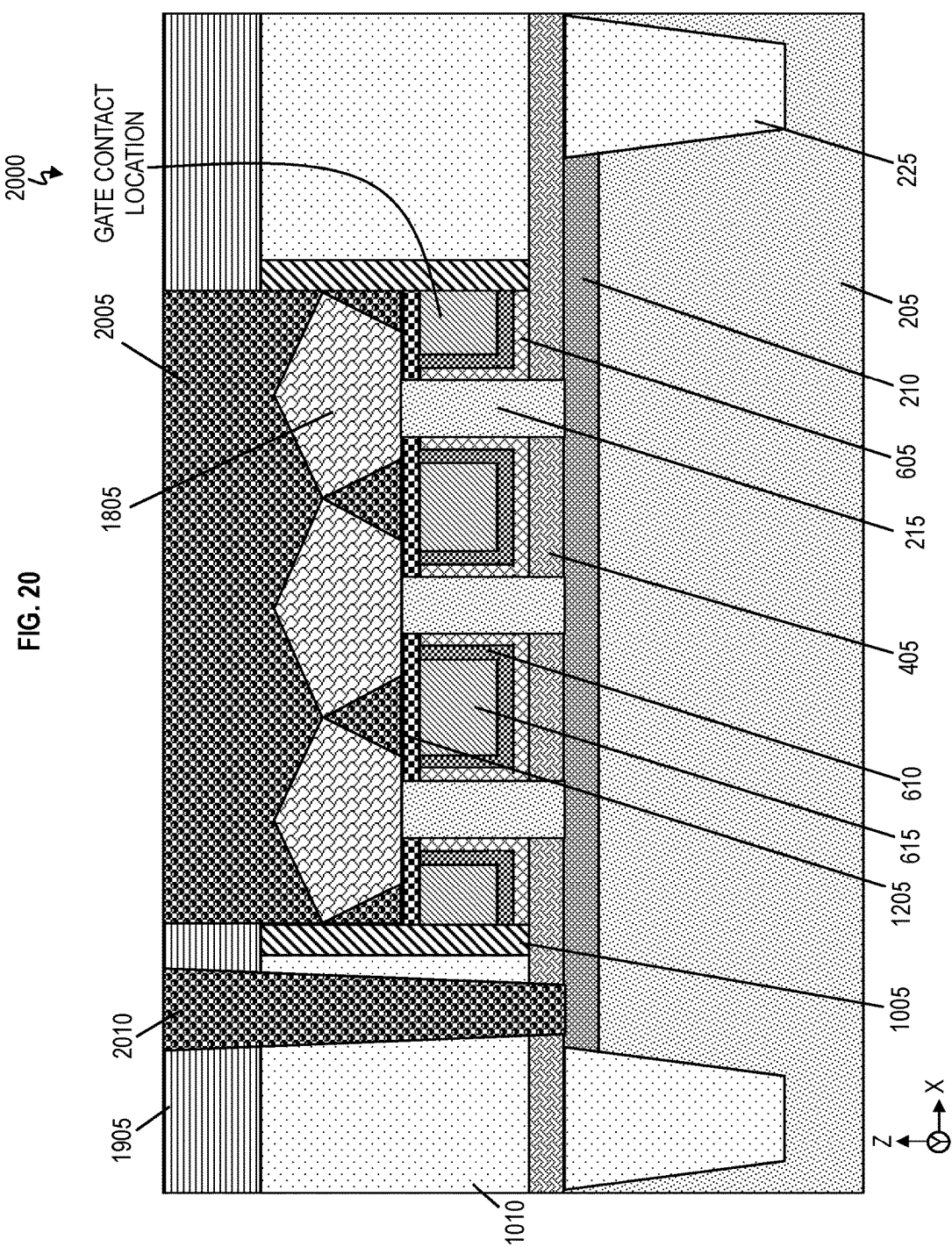
FIG. 20 is a cross-sectional view of a final structure depicting metallization according to one or more embodiments.

FIG. 20 is a cross-sectional view of a final structure 2000 depicting metallization according to one or more embodiments. The filling material 1905 previously in the trench 1605 is removed, while the filling material 1905 remains on the first and second gate encapsulation 1005 and 1010. Conductive material 2005 is formed on the top source/drain 1805 to be a top source/drain contact (CA).

A via may be formed down to the bottom source/drain 210 (i.e., the doped epitaxial layer), and the via is filled with conductive material 2010 to form the bottom source/drain contact (CA). Although not shown, it should be appreciated that a via is formed down to the gate materials, e.g., such as to the metal layer 615, and the via is filled with conductive material to form a gate contact (CB). An example gate contact location is illustrated for explanation purposes. An example of a gate contact 125 is illustrates in FIG. 1A, in which the cross-sectional view (also parallel to the fin) includes the gate.

The conductive material 2005 for the top source/drain contact (CA), conductive material 2010 for the bottom source/drain contact (CA), and conductive material for the gate contact (CB) may include Al, Cu, etc.

Figure 21:
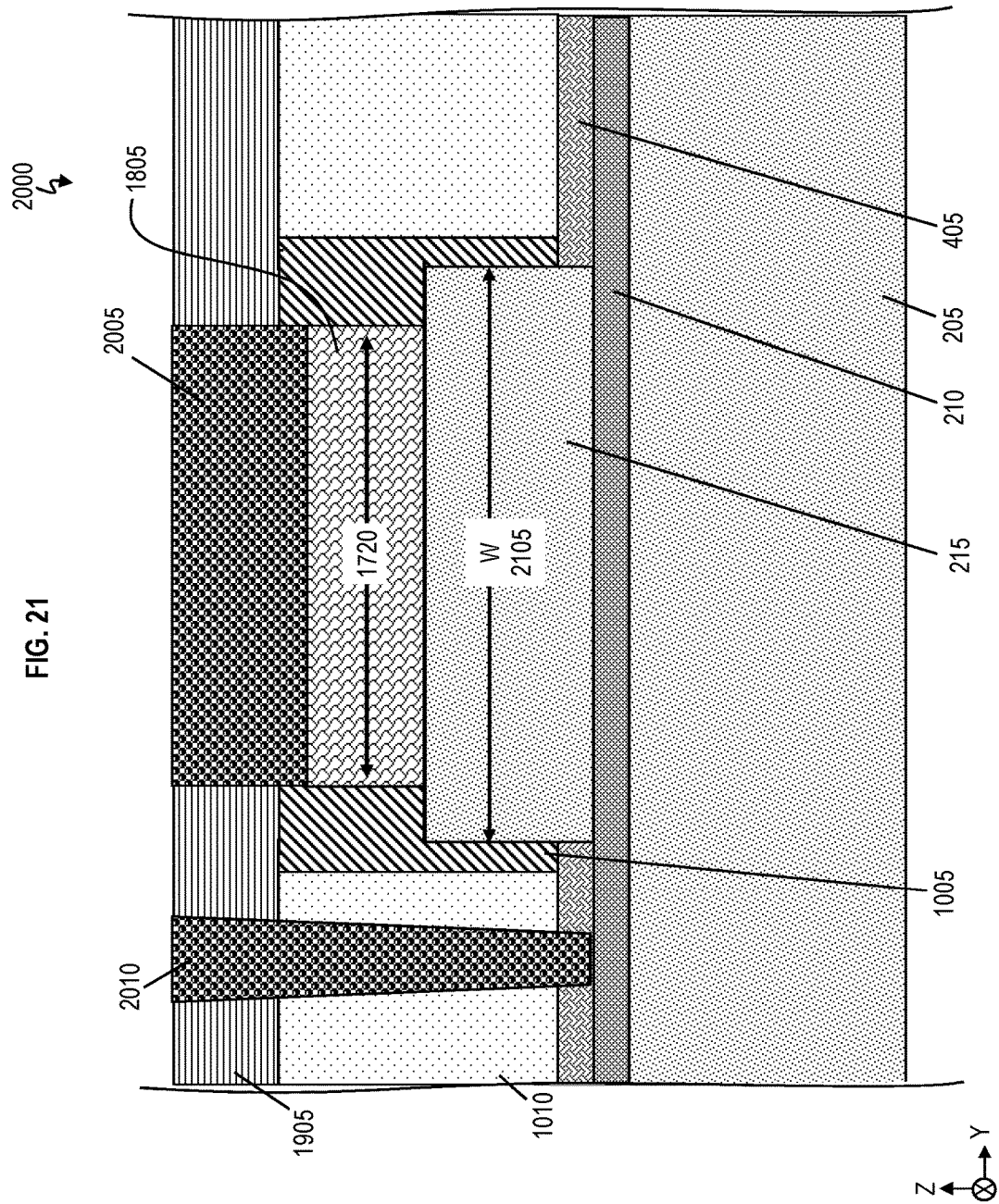
FIG. 21 is another cross-sectional view of the final structure depicting metallization according to one or more embodiments.

FIG. 21 is another cross-sectional view of a final structure 2000 depicting metallization according to one or more embodiments. FIG. 21 shows that the width of the conductive material 2005 of the top source/drain contact is the same or about the same as the width for the epitaxial top source/drain 1805 in the y-axis. The width of the conductive material 2005 of the top source/drain contact (CA) and epitaxial top source/drain 1805 corresponds to the second lateral dimension 1720.

An example fin 215 has a fin width W 2105 designated by a third lateral dimension in the y-axis. The fin width 2105 is parallel to the second lateral dimension 1720. The fin width W 2105 is greater than the second lateral dimension 1720 (i.e., greater than the width of the conductive material 2005 and epitaxial top source/drain 1805).

In FIGS. 18A-21, it should be recognized that the height of the first encapsulation layer 1005 is taller than the height of the epitaxial top/source drain 1805, thus allowing growth of the epitaxial top/source drain 1805 to be confined in the trench 1605. In one embodiment, growth of the epitaxial top/source drain 1805 may only be confined in the y-axis by the trench 1605 and not confined in the x-axis.

Figure 22:
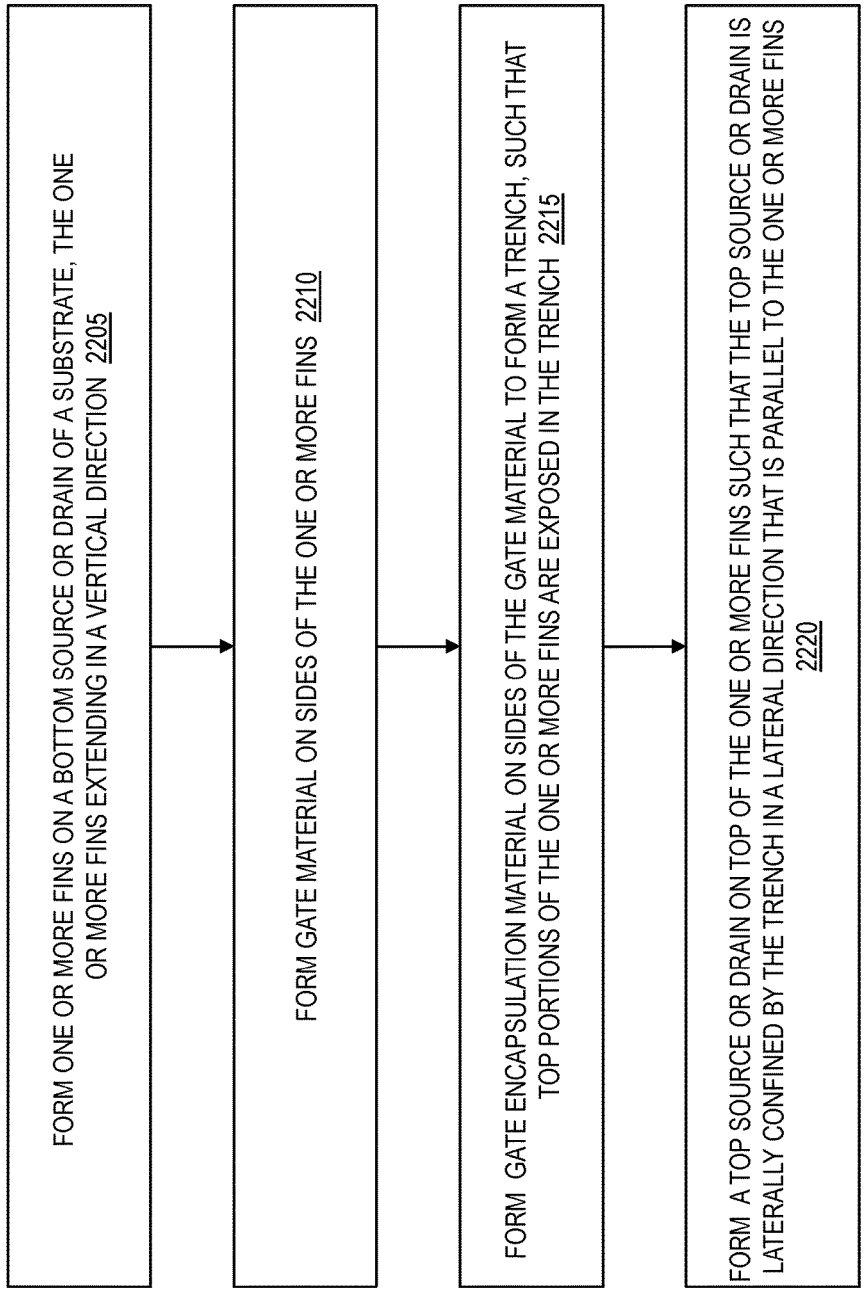
FIG. 22 is a flow chart of a method of forming a vertical field effect transistor (FET) according to one or more embodiments.

FIG. 22 is a flow chart of a method 2205 of forming a vertical field effect transistor (FET), such as the vertical transistors 100, 2000 with an optimized top source/drain region, according to one or more embodiments. Reference can be made to FIGS. 1-21.

At block 2205, one or more fins 215 are formed on a bottom source or drain 210 of a substrate, and the one or more fins 215 extend in a vertical direction (in the z-axis).

At block 2210, gate material (at least one of a high-k material 605, work function metal layer 610, and/or metal gate layer 615) to be positioned on sides of the one or more fins 215.

At block 2215, gate encapsulation material (at least one of first gate encapsulation layer 1005 and/or second gate encapsulation layer 1010) is formed on sides of the gate material (e.g., layers 605, 610, and/or 615) to form a trench 1605, such that top portions of the one or more fins 215 are exposed in the trench 1605.

At block 2220, a top source or drain 1805 is formed on top of the one or more fins 215 such that the top source or drain 1805 is laterally confined by the trench 1605 in a lateral direction 1720 (in the y-axis) that is parallel to the one or more fins 215.

The top source or drain 1805 is an epitaxial layer formed according to the one or more fins 215. The top source or drain 1805 is further laterally confined by the trench 1605 in another lateral direction 1705 (in the x-axis). The lateral direction 1720 and the another lateral direction 1705 both lie in a same plane perpendicular to the vertical direction (z-axis).

The top source or drain 1805 is formed to be wider than a fin width (of the one or more fins 215 in the x-axis) in the another lateral direction 1705. The top source or drain 1805 is formed to be shorter than a fin width (of the one or more fins 215 in the y-axis) in the lateral direction 1720.

The top source or drain 1805 is merged between adjacent fins. The top source or drain has a planar top surface. The gate encapsulation material (e.g., layers 1005, 1010) is formed on a spacer material 405. The gate encapsulation material includes one or more dielectric materials, such as gate encapsulation layer 1005 and/or second gate encapsulation layer 1010. The gate encapsulation material includes at least one of a nitride and an oxide.

Technical effects and benefits include improved integrated circuits on a wafer. The improved integrated circuit improves a computer processor. The top source/drain provides very low resistance, provides a large contact landing pad, and reduces the chance of shorting to the gate or bottom S/D contacts.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a vertical field effect transistor (FET), the method comprising:
    forming fins on a bottom source or drain of a substrate, the fins extending in a vertical direction;
    forming gate material on sides of the fins;
    forming gate encapsulation material on sides of the gate material to form a trench, such that top portions of the fins are exposed in the trench; and
    forming a top source or drain on top of the fins such that the top source or drain is laterally confined by the trench in a lateral direction that is parallel to the fins, a side edge of a portion of the top source or drain being in direct contact with a sidewall of the trench;
    wherein the fins extend vertically in a vertical direction;
    wherein the fins are on top of the bottom source or drain in the vertical direction while the top source or drain is on top of the fins in the vertical direction;
    wherein the trench is above the bottom source or drain.

2. The method of claim 1, wherein the top source or drain is an epitaxial layer grown according to the fins.

3. The method of claim 1, wherein the top source or drain is further laterally confined by the trench in another lateral direction; and
    wherein, in the another lateral direction, the fins are arranged on the side of each other.

4. The method of claim 3, wherein the lateral direction and the another lateral direction lie in a same plane perpendicular to the vertical direction.

5. The method of claim 3, wherein the top source or drain is formed to be wider than a fin width in the another lateral direction.

6. The method of claim 1, wherein the top source or drain is merged between adjacent fins.

7. The method of claim 1, wherein the top source or drain has a planar top surface.

8. The method of claim 1, wherein the gate encapsulation material is formed on a spacer material.

9. The method of claim 1, wherein the gate encapsulation material includes one or more dielectric materials.

10. The method of claim 1, wherein the gate encapsulation material includes at least one of a nitride and an oxide.

11. A vertical field effect transistor (FET) comprising:
    fins on a bottom source or drain of a substrate, the fins extending in a vertical direction;
    gate material positioned on sides of the fins;
    gate encapsulation material positioned on sides of the gate material to form a trench, such that top portions of the fins are exposed in the trench; and
    a top source or drain on top of the fins such that the top source or drain is laterally confined by the trench in a lateral direction that is parallel to the fins, a side edge of a portion of the top source or drain being in direct contact with a sidewall of the trench;
    wherein the fins extend vertically in a vertical direction;
    wherein the fins are on top of the bottom source or drain in the vertical direction while the top source or drain is on top of the fins in the vertical direction;
    wherein the trench is above the bottom source or drain.

12. The transistor of claim 11, wherein the top source or drain is an epitaxial layer from the fins.

13. The transistor of claim 11, wherein the top source or drain is further laterally confined by the trench in another lateral direction.

14. The transistor of claim 13, wherein the lateral direction and the another lateral direction lie in a same plane perpendicular to the vertical direction.

15. The transistor of claim 13, wherein the top source or drain is formed to be wider than a fin width in the another lateral direction.

16. The transistor of claim 11, wherein the top source or drain is merged between adjacent fins.

17. The transistor of claim 11, wherein the top source or drain has a planar top surface.

18. The transistor of claim 11, wherein the gate encapsulation material is formed on a spacer material.

* * * * *